US005396618A

United States Patent [19]

Fukui et al.

[11] Patent Number: 5,396,618

[45] Date of Patent: Mar. 7, 1995

[54] SELF-DIAGNOSING METHOD FOR DIGITAL SIGNAL PROCESSING SYSTEM

[75] Inventors: Takao Fukui; Kazutoshi Nomoto; Yoshihiro Murakami, all of Kanagawa, Japan

[73] Assignee: Sony Corporation, Tokyo, Japan

[21] Appl. No.: 35,229

[22] Filed: Mar. 22, 1993

[30] Foreign Application Priority Data

Mar. 25, 1992 [JP] Japan .................................. 4-097308

[51] Int. Cl.6 .......................... H04J 1/16; G01R 31/28

[52] U.S. Cl. .................................... 395/575; 371/15.1; 371/20.5; 370/13; 370/15

[58] Field of Search ..................... 371/15.1, 20.4, 20.5, 371/20.6, 24, 34, 71; 370/13, 15, 16, 16.1

[56] References Cited

U.S. PATENT DOCUMENTS

| | | | |
|---|---|---|---|
| 4,376,999 | 3/1983 | Abbott et al. | 370/16 |
| 4,631,719 | 12/1986 | Huffman et al. | 370/15 |
| 5,164,980 | 11/1992 | Bush et al. | 379/53 |
| 5,166,934 | 11/1992 | Tomiyama et al. | 371/16.1 |
| 5,265,089 | 11/1993 | Yonehara | 370/15 |

*Primary Examiner*—Charles E. Atkinson
*Assistant Examiner*—Albert Décady
*Attorney, Agent, or Firm*—William S. Frommer; Alvin Sinderbrand

[57] ABSTRACT

A method of self-diagnosis in a digital signal processing system. The digital signal processing system comprises a digital signal processing apparatus which includes a plurality of electronic components for processing signals in a plurality of channels. An output of the digital signal processing apparatus is coupled to an input of the digital signal processing apparatus. A central processing unit causes one after another of the electronic components to generate a predetermined signal while the other electrönic parts are in a condition for passing the predetermined signal therethrough. The CPU then checks whether or not the output of the digital signal processing apparatus is correct. When the output of the digital signal processing apparatus is not correct, the central processing unit outputs a unique reference number for the electronic component from which the predetermined signal was then generated. The reference number for the electronic component is visually indicated on a bar graph meter.

13 Claims, 25 Drawing Sheets

FIG. 15

| INPUT AUDIO NO. | DELAY | FILTER | EQ | CHANNEL FADER | ---- |
|---|---|---|---|---|---|
| # 1 | 0 | OFF | 1kHz+5dB | 0dB | |
| # 2 | 1.3 frame | High CUT/ON | OFF | -6dB | |
| # 3 | 2 frame | Low CUT/ON | 300Hz-3dB | +1dB | |
| ⋮ | ⋮ | ⋮ | ⋮ | ⋮ | |
| # 32 | 0 | Both/ON | OFF | -2dB | |

FIG. 16

| CHANNEL NO. | DELAY | FILTER | EQ | CHANNEL FADER | ---- |
|---|---|---|---|---|---|
| 1 | 0 | OFF | 1kHz+5dB | 0dB | |
| 2 | 1.3 frame | High CUT/ON | OFF | -6dB | |
| 3 | 2 frame | Low CUT/ON | 300Hz-3dB | +1dB | |
| ⋮ | ⋮ | ⋮ | ⋮ | ⋮ | |
| 16 | 0 | Both/ON | OFF | -2dB | |

SELF-DIAGNOSING METHOD FOR DIGITAL SIGNAL PROCESSING SYSTEM

BACKGROUND OF THE INVENTION

1. Field of the Invention

This invention relates to a digital audio mixer which mixes a plurality of digital audio signals gathered by a large number of microphones or like means to produce a single complete audio program, and more particularly to a digital audio signal mixer suitable editing an audio signal provided from a digital video tape recorder.

2. Description of the Related Art

It is a popular practice, in order to mix audio signals from a plurality of systems, to produce an audio program by means of a digital audio signal mixer (hereinafter referred to simply as digital mixer) irrespective of whether the signal sources are analog signal sources or digital signal sources.

An exemplary digital mixer wherein digital audio signals in a plurality of channels are mixed at a desired mixture ratio to obtain new digital audio signals in a second plurality of channels is constructed as shown in FIG. 1.

Referring to FIG. 1, the digital mixer shown therein is constructed such that it receives digital audio signals in 32 channels and outputs a program of digital audio signals in each of 4 channels. The digital audio signals #1 to #32 corresponding to 32 channels are received at input terminals 1 of the digital mixer and inputted to a routing switcher 2. The routing switcher 2 selects audio signals corresponding to 16 channels (CH1 to CH16) from the 32 channels of input audio signals. Each of the 16 output channels of the routing switcher 2 is processed successively by a mute switch 3, a de-emphasis and phase variation unit 4, a delay unit 5, a filter 6, an equalizer 7 and an insertion circuit 8, and finally, the sound volume for the channel is adjusted by a channel fader 9. Thereafter, the 16 channel signals are added by way of assignment switches 10 on four buses and then adjusted in sound volume by master faders 11 to make four programmed outputs 12 (PGM1 to PGM4).

More particularly, the digital audio signals #1 to #32 corresponding to the 32 channels are digital audio data and normally are signals in the AES/EBU format. In particular, the digital audio signals may be digital output signals from digital audio tape recorders or compact disk players and audio PCM (pulse code modulation) data signals to which additional information is added.

The routing switcher 2 determines which of the digital audio signals #1 to #32 should be allotted to the channels CH1 to CH16, and can allot the same signal, for example, the input signal #1, to all of the channels CH1 to CH16. The mute switches 3 are used to change over the signals in the channels CH1 to CH16 so that any digital audio signal which is not required by the operator may not be transmitted.

Each of the de-emphasis and phase variation units 4 includes a de-emphasis circuit which reverses emphasis processing with respect to input signals of which the high frequency band has been subjected to pre-emphasis.

Each of the de-emphasis and phase variation units 4 further includes a phase variation circuit which reverses the phase of a digital audio signal. Since such phase variation circuit is not required for playing back a compact disk, a music tape or a record the phase variation function is not normally provided for an audio amplifier provided in consumer audio equipment.

The phase variation circuit is used principally to provide phase correction of a signal produced by a microphone during sound recording. Microphones are constructed with a diaphragm that is vibrated by sound pressure and the vibrations of the diaphragm are converted into an electric signal. Microphones are divided into two types including a first type wherein a positive voltage is generated at non-dense portions of acoustic vibrations and a second type wherein a positive voltage is generated at dense portions of acoustic vibrations. Accordingly, when sound recording is performed using a plurality of microphones, the phases of the output signals from the microphones must be matched since the signals may have different polarities. If the phases are not matched, the acoustic vibrations of the microphones may cancel each other so that a low sound which is particularly low in directivity may fade away. Therefore, input signals provided for mixing by microphones must necessarily be matched in phase depending upon characteristics of the microphones, and phase reversers for this purpose are required for a mixer.

When an audio signal output from a digital video tape recorder is to be edited, and editing of the video image is performed by means of a digital multi-effector (DME) or a like apparatus, then the video image may be delayed by several frames. In such a case, the sound must also be delayed by an equal amount of time, and the delay units 5 are used to effect such a delay with respect to sound.

Each of the filters 6 includes a low frequency band cut filter and a high frequency band cut filter and is used, in the mixer, to remove artifacts and noise. The high frequency band cut filter is used to remove, for example, hysteresis noise which may be produced upon reproduction of a tape or a like recording medium on which an analog audio signal is recorded. Meanwhile, the high frequency band cut filter is used to remove surrounding low frequency noise such as a sound that resembles wind.

Each of the equalizers 7 is used to raise or lower the signal level in a certain sound region of an audio signal and is employed, in the mixer, as an effector device principally for making sound effects.

Each of the insertion circuits 8 has the function of releasing an external contact when the operator wishes to insert an external effector device (a limiter, a filter, an equalizer or the like) into the mixer. In particular, the insertion circuit 8 cuts the audio signal path at an insertion point and connects the cut path to the outside. Accordingly, if an insertion function is rendered operative but no connection is made to an external device, the sound is interrupted at the insertion point, and the input signal will therefore not be outputted.

Referring particularly to FIG. 31, when the insertion function is to be rendered inoperative, a switch 13 is switched to the upper connection shown in FIG. 31 so that the input and output are connected to each other, and the insertion function is not exhibited. On the other hand, if the insertion function is to be rendered operative, the switch 13 is switched to the lower connection so that both the input and the output are released to the outside at an insertion point 25. In this case, the operator will connect to the insertion out terminal the input of an effector device which the operator wants to use and will connect the output of the effector device to the insertion in terminal. In this manner, an effect the digital mixer does not have can be applied by way of an external apparatus.

Referring back to FIG. 1, the channel faders 9 have the function of adjusting the sound volumes in channels CH1 to CH16, and volume adjustment (from +12 dB to −∞) by the channel faders 9 the resulting signals are sent into the mixing buses by the assignment switches 10 for mixing of the signals in the channels CH1 to CH16.

The assignment switches 10 are each used to determine whether or not the volume-adjusted sound signal should be mixed, and when the switch is on, the sound is added, but when the switch is off, the sound is not added. Thus, each assignment switch 10 is an on/off switch for an input to the mixing buses.

The sound (for example, surround programs) added by the four mixing buses by way of the assignment switches 10 thus forms programs PGM1, PGM2, PGM3 and PGM4, and the outputs signals corresponding to the programs PGM1, PGM2, PGM3 and PGM4 are subject to final sound volume adjusted by the respective master faders 11. (While the range of the adjustment is normally from 0 dB to −∞, a positive gain may also be provided). After sound volume adjustment has been performed by the master faders 11, the signals are modulated back into signals in the AES/EBU format and outputted as the outputs PGM1 to PGM4 to the outside.

While the principal parts of the digital mixer for digital audio signals have been described above, problems in the conventional digital mixer will be described below. First, problems involved in conventional phase variation sound volume adjustment will be described.

Conventionally, a digital mixer having a phase variation function realizes phase reversal either by multiplying audio data by "1" by means of a multiplier 14 or by multiplying audio data by "−1" by means of another multiplier 15 as shown in FIG. 28(A). With the present method, however, even if a signal 28A which is not reversed in phase is continuous as shown in FIG. 28(B), when a phase reversal switch 16 is changed over to reverse the phase of the signal 28A, a discontinuous waveform 28B may be obtained depending upon the timing at which such phase reversal takes place, and as a result, a phase conversion waveform such as that shown in FIG. 28(C) may be obtained. Since a point of discontinuity is produced, noise is produced by the change over.

Particularly in the case of a digital audio signal, the signal has the form of discrete data, so that a phase conversion waveform as shown in FIG. 28(C) results in loss of data continuity, and consequently, a unique noise is produced. The presence of a discontinuous point in the digital audio signal produces frequency components that extend up to infinity, and when the signal is actually converted from the digital form into the analog form, folded noise is produced because frequency components higher than one-half of the sampling frequency cannot be represented. Thus, when a digital audio signal is to be changed over, noise will be produced unless the change over can be performed so as not to produce a discontinuous point.

In order to actually apply a phase variation function to a digital audio signal, it is a conventional practice to perform multiplication by "−1" using a DSP (digital signal processor) as shown in FIG. 28(A) to achieve variation in phase. When multiplication is performed using a DSP, the multiplication coefficient k normally assumes a value of the range $-1 \leq k \leq 1$, and processing is performed so that, when an input signal is multiplied by "1", the input signal itself is obtained; when the input signal is multiplied by "0.5" a signal having a level one half that of the input signal is obtained; when the input signal is multiplied by "0", no sound is obtained; when the input signal is multiplied by "−1", a signal having a phase opposite to that of the input signal is obtained; and when the input signal is multiplied by "−0.5" a signal having a level one half that of the input signal and having a phase opposite to that of the input signal is obtained. Accordingly, when it is desired to obtain a phase reversing function for a digital audio signal, the function can be realized with a circuit for selecting whether an input signal is to be multiplied by "1" or "−1". However, such a phase variation technique does not provide a solution to the problem of signal discontinuity, and the waveform shown in FIG. 28 will be produced.

Problems related to a fader which performs sound volume adjustment in the digital mixer will be now described.

When a digital audio signal is digitally adjusted in sound volume by means of a fader or a similar device, the actual signal processing is performed using a DSP. To carry out the processing, the fader multiplies the digital audio signal by a coefficient having a value ranging from 1 to 0. For example, if the digital audio signal is multiplied by "1", the input signal maintains its level but if it multiplied by "0" the level of the input signal is reduced to zero, that is, no sound. FIG. 29 shows an example of a conventional digital fader.

Referring to FIG. 29, a control value output from a fader 17 is converted into digital data by an analog to digital converter 18 and is read and converted into coefficient data ranging from 1 to 0 by a CPU (central processing unit) 19. The coefficient data is written into a data interpolator 20.

In actual operation of the circuit shown in FIG. 29, the timings of the coefficient value transferred from the CPU 19 to which the coefficient value is applied are shown in FIG. 6(C). Referring to FIG. 6(C), the digital audio data is updated with a period of 1/fs (where fs is a sampling frequency). Meanwhile, since the digital audio signal is communicated in the form of a serial signal inside of the mixer, the varying digital audio data values No. 1, No. 2, . . . , No. N are provided as seen in FIG. 6(C). On the other hand, when fader coefficients Fdn-1, . . . are to be written, it is almost impossible for the CPU 19 to vary the coefficient for each 1/fs period in synchronism with the sampling frequency fs of the digital audio signal.

Two problems are involved: (1) While a master clock signal of the CPU 19 must be synchronized with the sampling frequency fs of the digital audio signal, an apparatus having a plurality of inputs and outputs such as a mixer cannot determine with which one of the plural inputs the apparatus should be synchronized or how to proceed when an out-of-synchronization condition occurs, and accordingly, it is difficult to assure proper operation of the CPU.

(2) Even if the problem described above in paragraph (1) could be overcome, so that the CPU could re-write the coefficient in synchronism with the sampling frequency fs of the digital audio signal, there would be a very heavy processing burden on the CPU to re-write the coefficient for each 1/fs period. That is it might be necessary to provide one CPU for each fader, which is not practical.

Accordingly, the fader coefficient Fdn-1, Fdn or Fdn+1 can be varied only once over several variations of the digital audio signal as seen from FIG. 6(C). Actually, in conventional digital mixers, the sampling frequency fs of the audio signal is 44.1 kHz or 48 kHz while the period for updating a fader coefficient is 60 Hz, and accordingly, the fader coefficient is varied over about 1,000 variations of the audio data.

The fader coefficient will vary in a stepwise fashion as shown by the "real data" in FIG. 6(B). If the coefficient is used as it is for multiplication of the digital audio data by a multiplier 21 that is part of the DSP shown in FIG. 29, then modulation noise is formed at the transfer period (60 Hz) of the coefficient and will produce a rumbling noise (known as "dipper noise").

Therefore, in the DSP of FIG. 29, the fader coefficient transferred from the CPU 19 is not used as it is but rather is used for multiplication after interpolation by the interpolator 20. Thus, use of interpolation data as illustrated in FIG. 6(B) will be described.

If a non-interpolated coefficient which exhibits a stepwise variation as shown in FIG. 6(B) is used, then modulation noise is produced as described hereinabove. Therefore, in order to interpolate the coefficient within the DSP, two different time constants of 20 ms and 5 ms are employed as the time constant for interpolation. Determination of the appropriate time constants is based on results of an actual listening test.

The test method will now be described. First, the time constant of the interpolator 20 is set to a high value (for example, 200 ms). Thus, when the fader 17 is varied up and down, the time constant is sufficiently high that no modulation noise will be produced, but naturally the fader is slow in reaching a desired value as seen from the curve 6B in FIG. 6(A). In this instance, while no noise is produced, a great deal of time is required before the sound becomes loud after the fader 17 is adjusted to increase the volume or conversely before the sound becomes muted after the fader 17 is adjusted to decrease the volume, and consequently, the perceived change in the sound is delayed. In short, as the time constant becomes smaller, the response becomes faster, and if the time constant is reduced to a value near a limit at which no modulation noise is produced, then interpolation which does not produce noise and has a fast response can be realized. The time constant obtained by such testing is 20 ms.

Referring back to FIG. 29, is a fader control data mute switch 22 is switched on or off and the fader control 17 is disconnected or connected, then although no noise is produced, the response is still perceived to be slow. In short, while an acceptably fast response is obtained upon increasing or decreasing adjustment of the fader control 17, the response is perceived to be slow upon switching on or off of the mute switch 22. Thus, with the mute switch 22 as well, the time constant is gradually reduced until an acceptable response is provided. The time constant obtained in this manner is 5 ms.

In this instance, while it appears that actuation of a switch or a like element in one direction does not particularly produce noise when the coefficient is interpolated, nevertheless, if the fader coefficient is varied rapidly from "0" to a certain value or from a certain value to "0" then a point of discontinuity occurs in the audio data. Upon conversion of the digital audio data having the point of discontinuity into analog data, folded noise is produced according to the sampling theorem, and noise is perceived like that described hereinabove in connection with phase variation.

Thus, the problem is that, if the same time constant is used in the interpolator 20 both when the mute switch 22 is switched on or off and when the fader 17 is operated, and if the time constant is adjusted to be appropriate for the mute switch 22, then noise is produced, but on the other hand, if the time constant adjusted to be appropriate for the operation of the fader 17, then the response is slow.

Problems related to a conventional effector device for a digital mixer will be now described. Conventionally, when sound effect is to be inserted by means of an effector (equalizer or filter), switching of the effector 23 into the system is performed by simple on/off operation of a switch 24 as shown in FIG. 30. However, in the case of a digital audio signal, this will result in loss of data continuity, and consequently, switching noise is sometimes produced.

For example, when an equalizer is used as an effector, and assuming a certain sound region (around $f_0$) is boosted by a significant factor, for example, by +10 dB as in an EQ frequency characteristic shown in FIG. 30(B), then, if the input audio signal contains sound around $f_0$, simple switching of the switch 24 as in the conventional arrangement results in a difference in output level depending on whether the switch 24 is switched to the input side or to the effector side. This is illustrated in FIG. 11(B). Referring to FIG. 11(B), switching on the switch 24 causes a point of discontinuity in audio data 11C, as seen from a curve 11D, because of an abrupt change in level of the audio signal.

Problems related to the insertion circuits 8 will now be described. Generally, in an audio mixer, the internal level (head room) is set lower than an input level taking into consideration that audio signals from a plurality of inputs are to be added. If an audio signal is outputted from the insertion point 25 to the outside with such interval level that is lower than the input level, then a full-bit input is not provided to an external effector apparatus and an optimum S/N ratio cannot be obtained. Thus, if an audio signal is outputted from the insertion point 25 (FIG. 31) with the level thereof having been returned to the input level, as when the external effector provides some gain (by boosting high- or low-level sounds), then the data will be clipped as shown in FIG. 13(B).

If the internal level is not lowered, and data clipping occurs, then the data cannot be restored, but if the internal level is set low, then with the level being subsequently lowered by the master fader 11, normal data can be outputted as described above. If input signals are added without change, then clipping naturally occurs, and consequently, even if the master fader 11 is operated to reduce the signal level, the clipped sound is only reduced in volume, but the clipping is not remedied. Accordingly, the internal level of the mixer must be kept low.

As described hereinabove, the insertion point 25 (FIG. 31) is provided at a stage next to the equalizer 7 but preceding the channel fader 9 (FIG. 1), and accordingly, the internal level is lower than an input level. This is done not only to prevent clipping caused by addition of audio data, as described above, but also because the mixer involves effects which produce some gain. For example, an equalizer 7 may increase the sound of a certain band by up to 15 dB. Therefore, if the internal level is not low, even with the signal level being lowered by the channel fader 9, clipping by the equalizer 7 cannot be avoided.

Thus, optimum input and output levels of the insertion circuit depend upon the manner in which the operator uses the insertion circuit.

Moreover, in the mixer described above, when inputs supplied by way of the routing switcher 2 are provided as inputs to the mixer, and if the setting of the routing switcher 2 is changed, then, according to conventional practice, the parameter settings of the channels CH1 to CH16 of the mixer must also be changed. Accordingly, upon changing channels, the parameters must be re-set.

In particular, given that conventionally an equalizer 7, a filter 6, a fader 9 and so forth are provided to perform signed processing for each of the 16 channels CH1 to CH16, according to a conventional snapshot automation technique (Japanese Patent Publication Application No. Heisei 2-47125 and so forth), parameters for the equalizers, the filters, the faders and so forth appropriate to the inputs for the channels CH1 to CH16 are instantaneously read out.

For example, in the case of scene setting data shown for example in FIG. 16, parameters for equalizers, filters, faders and so forth are changed instantaneously in accordance with the scene setting data. In short, a snapshot varies the parameter values with regard to input signals provided from the routing switcher 2. Accordingly, there is a problem in that the snapshot data does not reflect the ultimate source (audio input signal #) which is inputted to channel CH1, for example.

An output (PGM) level indicating apparatus for the mixer described above or as otherwise proposed (Japanese Patent Publication Application No. Heisei 2-47125) will now be described.

Referring to FIG. 17, the mixer described above includes a processor rack 26 for processing data, and a control panel 27 for providing a man-machine interface. The control panel 27 includes a meter 28 for indicating a sound volume/sound quality data level thereon, and data for the meter 28 is produced from data corresponding to the external outputs PGM1 to PGM2 (FIG. 1).

A level indication on the meter 28 is not an indication of the PGM meter data per se but rather is an indication in units of dB. Meter data to be displayed on the meter 28 is produced by the processor 26 as seen from the flow chart presented as FIG. 20.

The mixer of FIG. 1 is an audio mixer of the full digital processing type, and accordingly, the meter data also is in the form of digital data. In general the meter 28 is a bar graph meter having 100 segments, for example, as shown in FIGS. 18(A) to 18(C) or 19(A) to 19(C), and the meter data is 8-bit data.

In a conventional meter indication, the reference level is not typically added to the meter data by the control panel 27 and then sent with the meter data to the meter 28 as shown in the flow chart of FIG. 20; rather, the meter data is produced from audio output data by the processor rack 26 and is transmitted to the control panel 27 so that the bar graph meter 28 is lit in accordance with the meter data while an indication of a reference level is performed by changing the color (for example, from green to orange) of those segments 29 that are higher than a reference level, as shown in FIG. 32. Alternatively, a reference level setting knob 30 and another bar graph meter 31 may be used to indicate a reference level.

Such methods, however, are disadvantageous in that a meter indication and a reference level indication are not easily read together, and the latter method complicates the hardware because the additional bar graph indicator is required.

In addition, for the digital mixer as described above, maintenance is required and it is necessary to test the functioning of the circuit blocks in the mixer. If the mixer does not include a self-diagnosing system which checks the functioning of the circuit blocks, particularly the DSPs and so forth which perform the digital processing, then audio signals at all of the outputs must be checked while inputting audio signals to all of the inputs.

Even if the digital mixer includes a self-diagnosing system, if the mixer does not have a reference indicating function for the DSPs or integrated circuits making up the mixer, then measurements must be performed using measuring instruments or the like. In this manner, a conventional self-diagnosing system cannot eliminate the need for cumbersome jigs and/or tools and complicated maintenance operations.

SUMMARY OF THE INVENTION

Accordingly, it is an object of the present invention to provide a digital mixer wherein there is a reduction in the noise which is produced by signal discontinuity caused by switching the position of a switch for phase charging or for sound volume adjustment.

It is another object of the present invention to provide a digital mixer wherein there is no signal clipping when an insertion in signal has the same level as an insertion out signal.

It is a further object of the present invention to provide a digital mixer wherein setting of various parameters for an equalizer, a filter, a fader and an assignment switch for each channel is facilitated upon changes in the input signals are by means of a routing switcher.

It is a still further object of the present invention to provide a mixing console which makes it easy to observe the level indication for the mixer output data and is simple in construction.

It is a yet further object of the present invention to provide a mixer wherein a self-diagnosis during maintenance can be performed rapidly and conveniently.

In order to attain the objects described above, according to one aspect of the present invention, there is provided a method of performing self-diagnosis in a digital signal processing system which includes a digital signal processing apparatus, the method including the steps of repeatedly generating a test signal within the digital signal processing apparatus, selectively connecting an output port of the apparatus in sequence to plural input ports of the apparatus and transmitting the test signal from the output port of the digital signal processing apparatus to the selected input port of the digital signal processing apparatus by way of a diagnosis loop provided between the input and output ports of the digital signal processing apparatus to effect a loop test of the digital signal processing apparatus, processing data representative of a result of the test, indicating the processed data on an indicator, and when the result of the test represents an error condition in an electronic component of the apparatus, providing to the indicator a reference number corresponding to the electronic component so that the reference number is indicated on the indicator.

According to another aspect of the present invention, there is provided a digital signal processing system having a having a self-diagnosing function, which comprises a digital signal processing apparatus including a plurality of electronic components for processing a signal within a signal channel, each of the electronic components having a unique reference number, means for coupling an output of the digital signal processing apparatus to an input of the digital signal processing apparatus, control means for causing one after another of the electronic components to generate a predetermined signal while the other electron components are in a condition in which the predetermined signal passes therethrough, determining whether or not the output of the digital signal processing apparatus is correct and when the output of the digital signal processing apparatus is not correct, outputting the reference number of the electronic component which then generated the predetermined signal, and means for visually indicating the reference number of the electronic component.

Accordingly to a further aspect of the present invention, there is provided a digital signal processing system having a self-diagnosing function, which comprises a digital signal processing apparatus including a plurality of signal channels each made up of a plurality of electronic components for processing signals within the respective channel, each of the electronic components having a unique reference number, means for coupling an output of the digital signal processing apparatus to an input of the digital signal processing apparatus, control means for causing one after another of the electronic components to generate a predetermined signal while the other electronic components are in a condition in which the predetermined signal passes therethrough, determining whether or not the output of the digital signal processing apparatus is correct and, when the output of the digital signal processing apparatus is not correct, outputting the reference number of the electronic component which then generated the predetermined signal, and means for visually indicating the reference number of the electronic component.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 15 is a table illustrating an example of scene setting data;

FIG. 16 is a table illustrating an example of conventional scene setting data;

DETAILED DESCRIPTION OF THE PREFERRED EMBODIMENT

Before describing the overall digital signal processing system which forms the digital mixer to which the present invention is applied, there will first be described the various component circuits of the digital mixer which solve the problems of the conventional digital mixers described hereinabove.

Phase Variation

In a conventional digital mixer, when phase variation or adjustment of the sound volume or the sound quality is to be performed, the coefficient is instantaneously switched over from "1" to "−1" or vice versa by means of a switch, and as a result, a point of discontinuity is produced which causes noise as described hereinabove. In order to prevent production of such noise, a phase variation circuit for the digital mixer of the present invention is arranged so that the coefficient for multiplication is varied gradually from "1" to "−1" or vice versa.

Figure 2A:
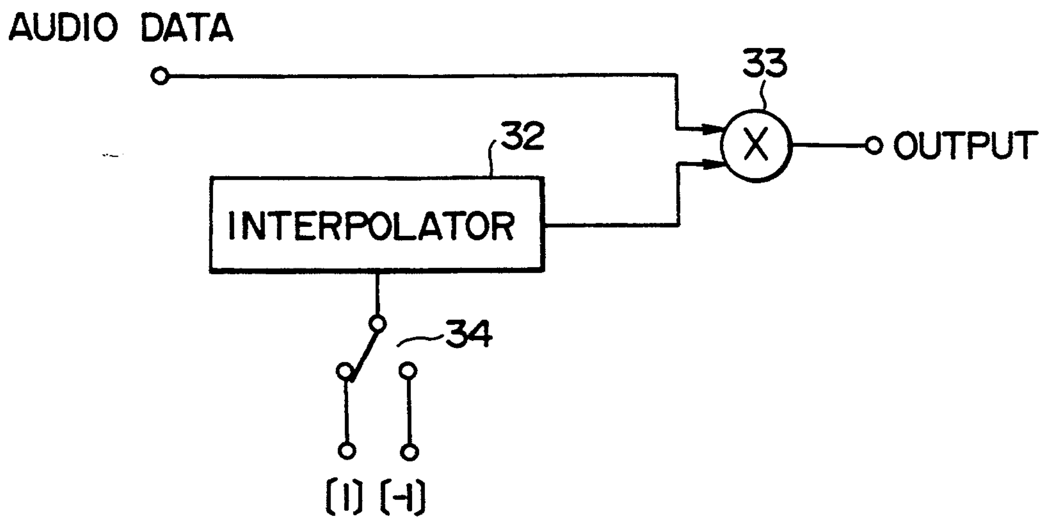
FIGS. 2(A) and 2(B) are respectively a block diagram of a phase variation circuit and a graph illustrating phase variation.

Referring first to FIG. 2(A), the phase variation circuit employs an interpolator formed from an IIR filter or a like circuit for varying the coefficient from "1" to "−1" or from "−1" to "1". When reversal of the phase is required, the phase variation switch 34 is switched to the appropriate side. Consequently, the interpolator 32 interpolates coefficient data k to provide an output signal which is multiplied by audio data at a multiplier 33, and phase variation proceeds gradually in the manner of an exponential function as seen from FIG. 2(B). The output of the multiplier 33, which exhibits this gradual phase variation, is provided as the output of the phase variation circuit.

Figure 2B:
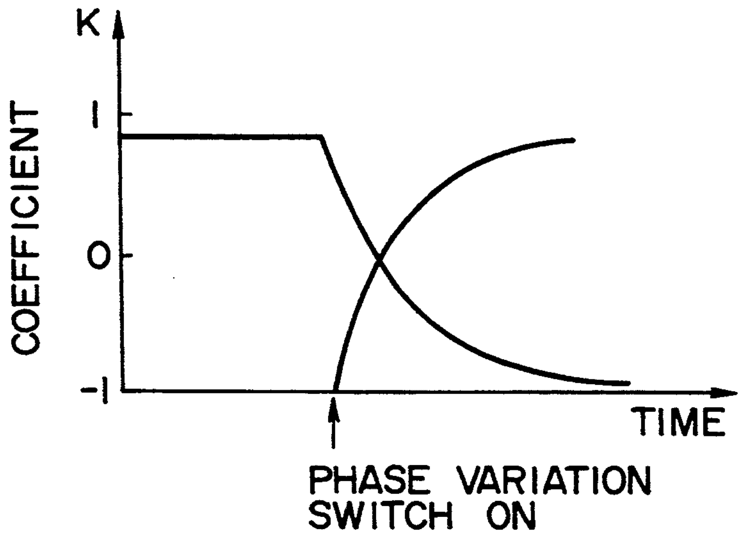

The interpolation characteristic illustrated in FIG. 2(B) is obtained by gradually varying the coefficient k exponentially from "1" to "−1" or reversely from "−1" to "1" by means of the interpolator 32 on the basis of a time constant which determines a period over which complete phase is achieved after the phase variation switch 34 has been switched on. A listening test has shown that it is suitable to set the time constant for interpolating the coefficient k at 3 ms to 5 ms. If the phase variation function is operated using such an interpolated coefficient k, then a signal waveform such as that shown in FIG. 4 is obtained, and as seen from FIG. 4, the continuity of the waveform is maintained even within the portion at which the phase is reversed.

Figure 4:
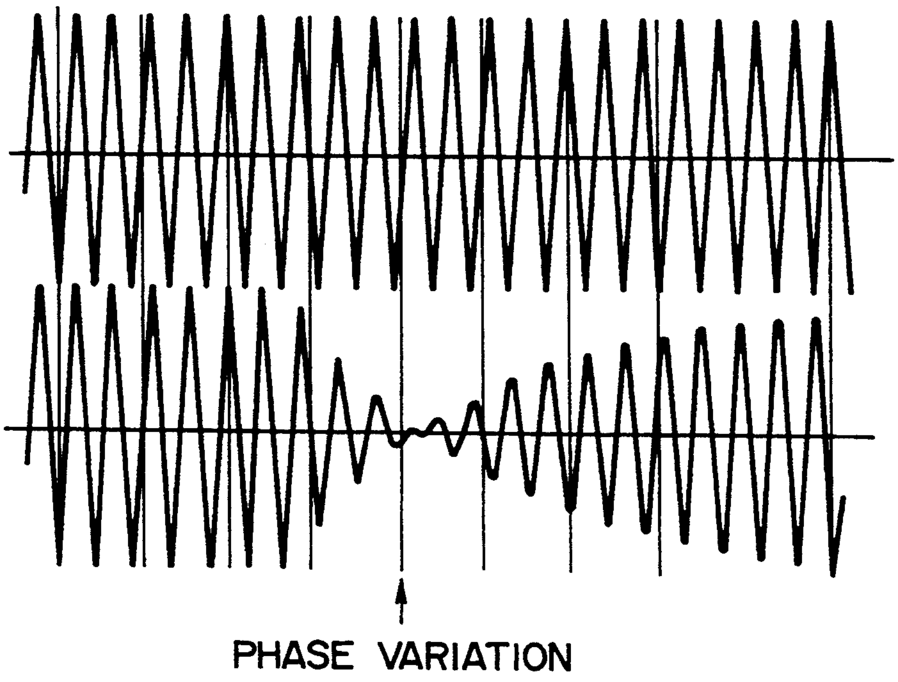
FIG. 4 is a waveform diagram of an audio signal during phase variation by the phase variation circuit of FIG. 3.

The waveform shown in FIG. 4 is a waveform of an analog output signal produced when the coefficient k is varied gradually from "1" to "0" and then to "−1". It can be seen that the level of the signal waveform gradually decreases to 0 and then a waveform having a reversed phase and a gradually increasing level is produced, so that smooth phase reversal occurs.

Figure 3:
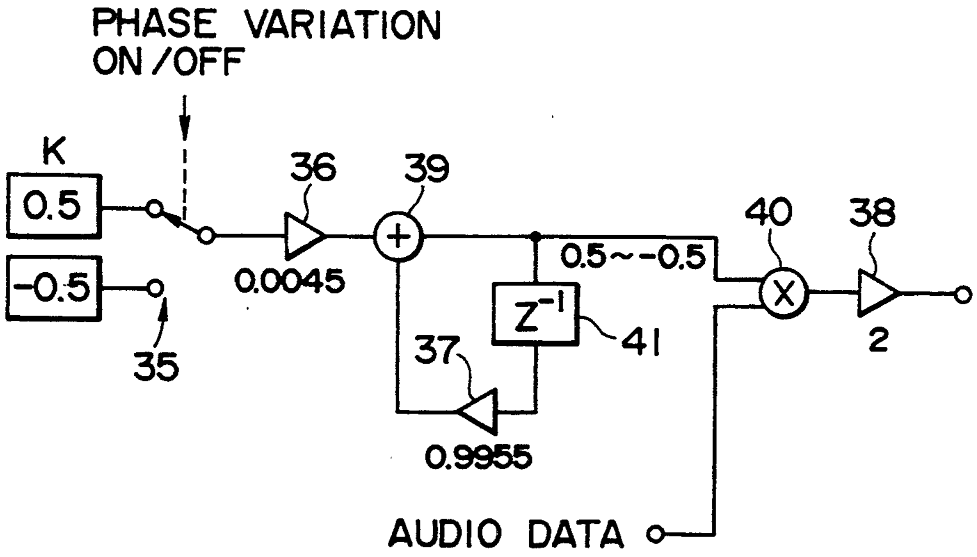
FIG. 3 is a block diagram showing a phase variation circuit to which the present invention is applied.

FIG. 3 shows an exemplary construction of the interpolator 32 which is formed using a DSP (digital signal processor). The interpolator 32 as shown includes a phase variation switch 35, three coefficient multipliers 36, 37 and 38, an adder 39, a multiplier 40 and a one sample delay RAM 41.

The interpolator 32 sets the input coefficient data k to "0.5" or "−0.5" and when an instruction to perform a phase variation is received, the switch 35 is switched to the side of the coefficient "−0.5" but on the other hand, when an instruction to stop a phase variation is received, the switch 35 is switched to the side of the coefficient "0.5". The coefficient data k is multiplied by a coefficient 0.0045 at the at the coefficient multiplier 36. Meanwhile, coefficient data prior in time by one sample is delayed for one sample period by the delay RAM 41 and then multiplied by another coefficient "0.9955" at the coefficient multiplier 37, and the resulting value output from the multiplier 37 is added to the output of the coefficient multiplier 36 by the adder 39. Then, the data value output from the adder 39 and the digital audio data are multiplied at the multiplier 40 and the result is doubled by the coefficient multiplier 38. Consequently, a digital audio signal having its phase varied in an exponential fashion is provided by the coefficient multiplier 36 as an output signal for the interpolator 32.

Multiplying the audio data by an interpolated coefficient to perform phase variation makes it possible to achieve phase variation without producing a point of discontinuity in the audio signal, as is seen from FIG. 4.

While the interpolation characteristic described above exhibits an exponential variation, alternatively linear interpolation wherein the coefficient k varies linearly may be employed.

Sound Volume/Sound Quality Adjustment

Figure 29:
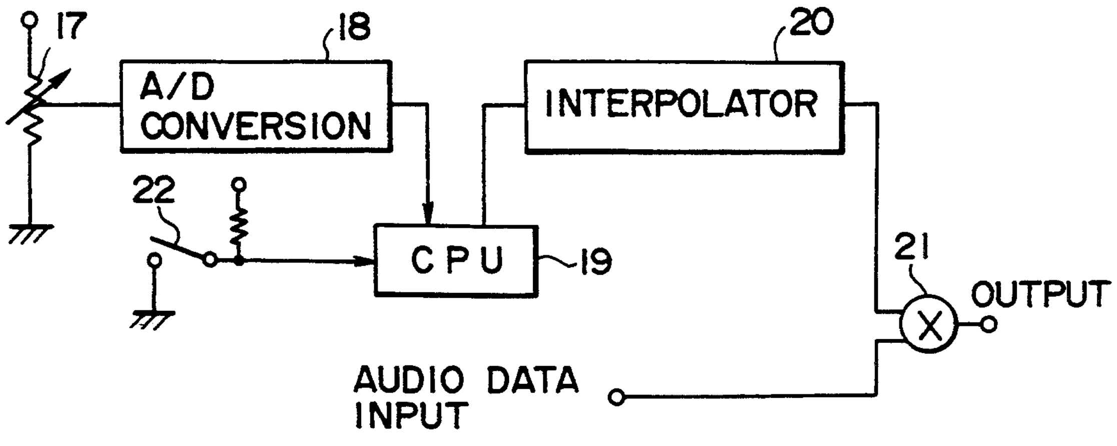
FIG. 29 is a block circuit diagram of a conventional fader switching circuit.

As described hereinabove, the fader switching circuit shown in FIG. 29 is disadvantageous in that, if the coefficient is interpolated with the same time constant both upon on/off switching of the mute switch 22 and upon operation of the fader control 17, then either modulation noise (dipper noise) is produced if the time constant appropriate for the mute switch 22, is used, or, if time constant appropriate for operation of the fader 17 is used, the response is delayed.

A sound volume/sound quality adjustment circuit employed in the present digital mixer is constructed such that, in order to eliminate modulation noise and assure quick response, an interpolator detects whether the mute switch is switched on or off or the fader control is operated, and the coefficient is selectively interpolated with the suitable one of two time constants that are respectively appropriate for the two cases.

Figure 5:
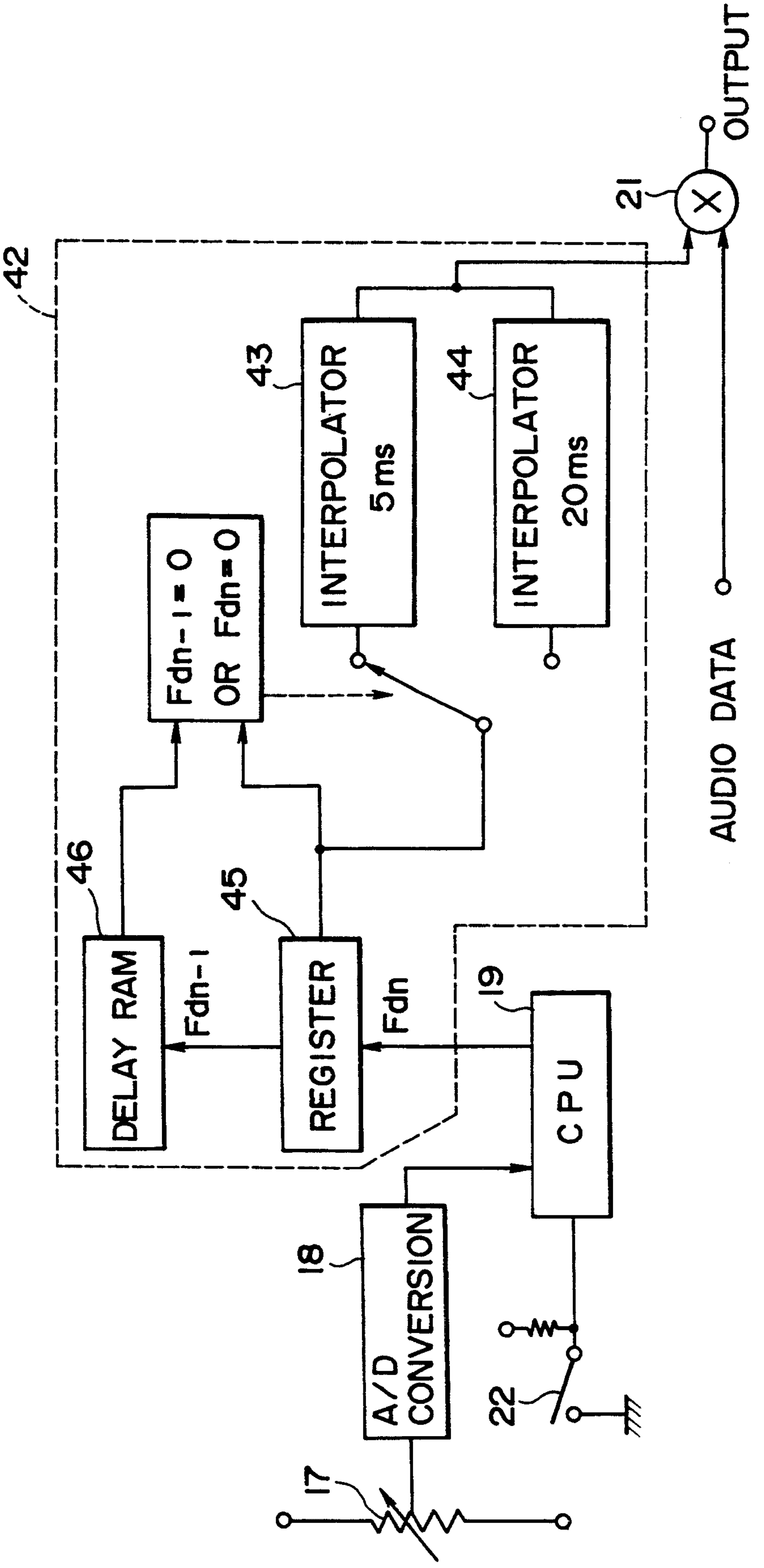
FIG. 5 is a block diagram showing a fader switching circuit.

Referring to FIG. 5, there is shown a system for interpolating the coefficient to adjust the sound volume. A coefficient value set by a fader control 17 is converted from an analog value into a digital value by an analog to digital (A/D) converter 18. A mute switch 22 is connected to a CPU 19 in parallel with the A/D converter 18 and when the mute switch is on (open), the coefficient set by the fader control 17 is communicated to the CPU 19, but when the mute switch 22 is off, the coefficient "0" is transmitted to the CPU 19. In particular, an on/off instruction regarding the mute switch 22 is detected by the CPU 19.

Figure 6A:
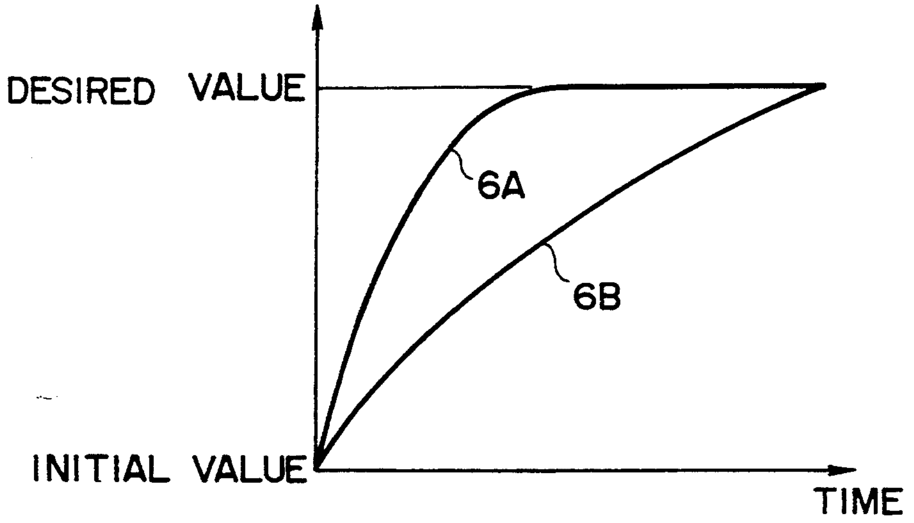
FIGS. 6(A) to 6(C) are waveform diagrams illustrating operation of a fader switching circuit of FIG. 5.

The CPU 19 reads the fader coefficient data after analog to digital conversion by the analog to digital converter 18 and writes the fader coefficient into a data interpolation block 42. The data interpolation block 42 includes a pair of data interpolators 42 and 44 having interpolation time constants of 5 ms and 20 ms, respectively. Thus, as seen from FIG. 6(A), the data interpolator 43 interpolates a desired value with the shorter time constant of 5 ms (curve 6A) while the outer interpolator 44 interpolates the desired with the longer time constant of 20 ms (curve B).

Figure 7:
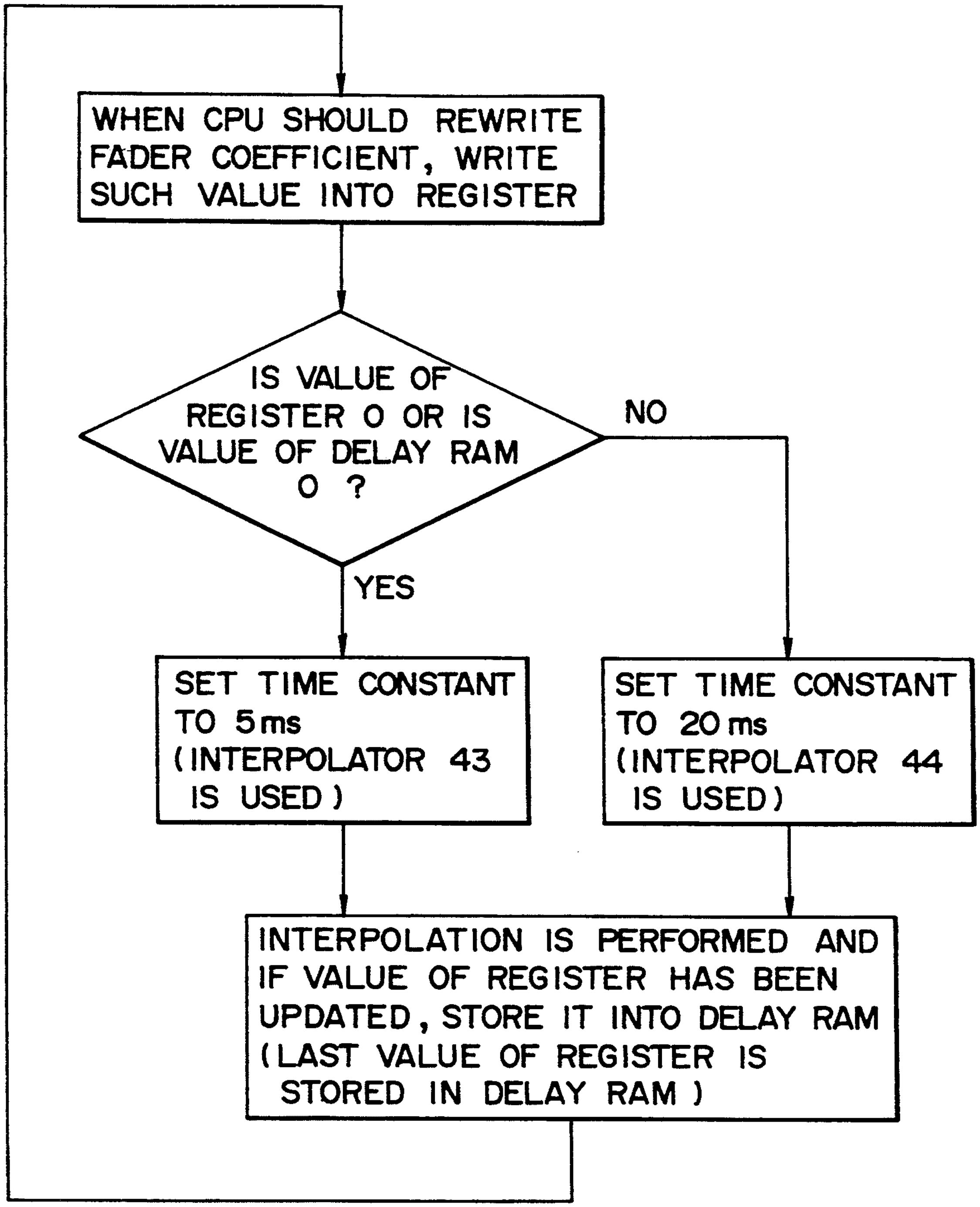
FIG. 7 is a flow chart illustrating operation of the fader switching circuit of FIG. 5.

Operation of the data interpolators will now be described with reference to the block diagram of FIG. 5 and the coefficient interpolation flow chart of FIG. 7.

A data interpolation coefficient, after conversion into a digital value as described above, is written into the CPU 19. The coefficient thus written in the CPU 19 is then written into a register 45 in the data interpolation block 42. It is to be noted that the register 45 may be replaced by a DRAM. The coefficient data written in the register 45 is written into a delay RAM 46 when the succeeding data is transferred to the register 45. Accordingly, in the data interpolation block 42, a present coefficient value Fdn is held in the register 45 while an immediately preceding coefficient value Fdn-1 is held in the delay RAM 46.

In this condition, if the mute switch 22 is switched on or off to vary the coefficient, then one of the coefficient values Fdn and Fdn-1 changes to 0. When to coefficient value Fdn=0 or Fdn-1=0, the desired value is interpolated using shorter time constant of 5 ms by means of the data interpolator 43, but in any other case, that is, when both of the coefficient values Fdn and Fdn-1 are not equal to zero, the desired value is interpolated with the longer time constant of 20 ms using the other interpolator 44.

Figure 6B:
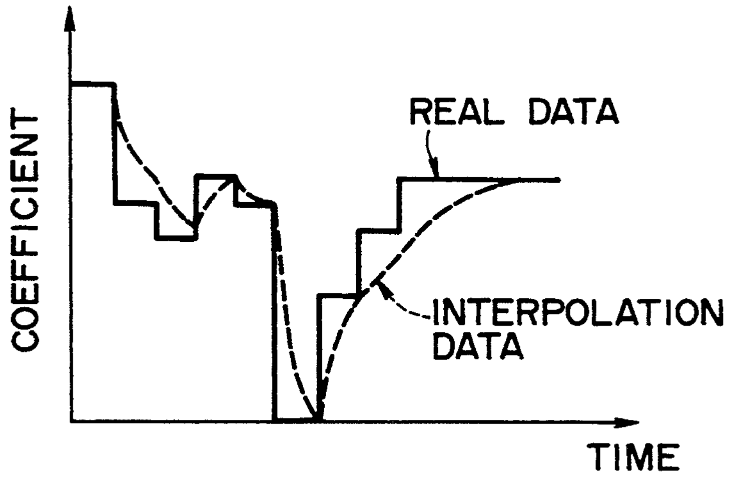
Figure 6C:
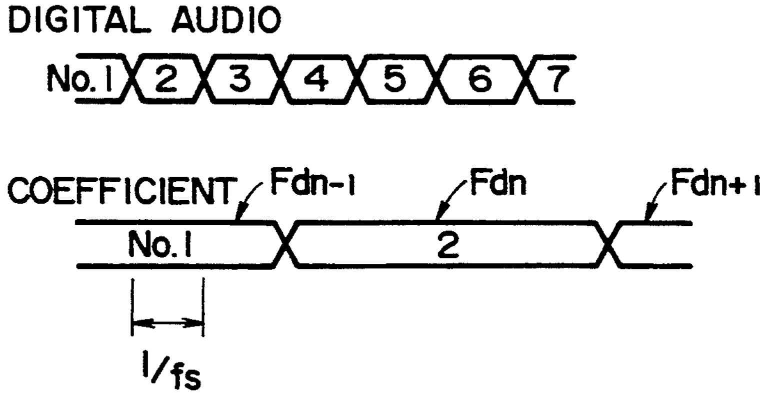

With such interpolation as described above, when the coefficient value of the fader control 17 is varied to form data transmitted to the CPU 19, smooth coefficient data are obtained to perform interpolation, but when the mute switch 22 is switched on or off, interpolation can be performed with a rapid response as seen from FIG. 6(B).

Switching of Effector Device

Figure 30A:
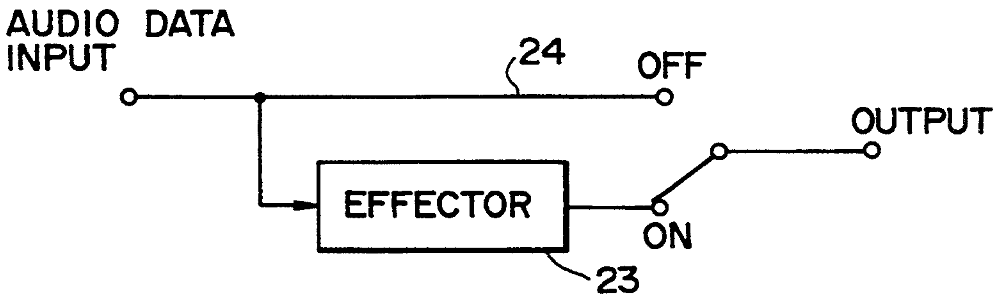
FIG. 30(A) is a block circuit diagram showing a conventional effector switching circuit of FIG. 30(B) is a diagram illustrating operation of the effector switching circuit of FIG. 30(A)
Figure 30B:
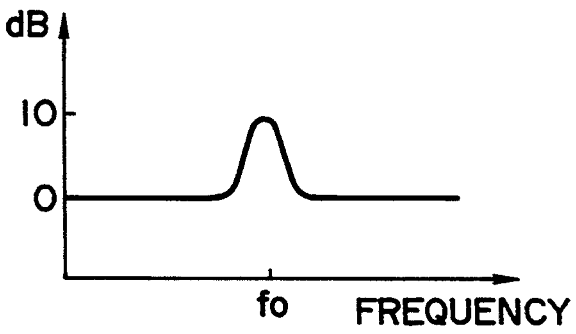
Figure 31:
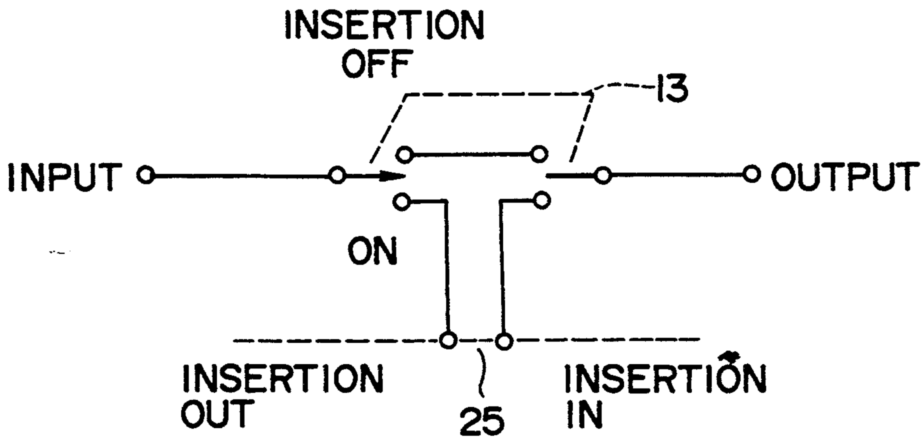
FIG. 31 is a circuit diagram showing a conventional insertion circuit.

As described hereinabove with reference to FIG. 30, when an effector device is switched simply by means of the switch 24, the continuity of digital audio data is lost so that switching noise is produced.

Figure 8:
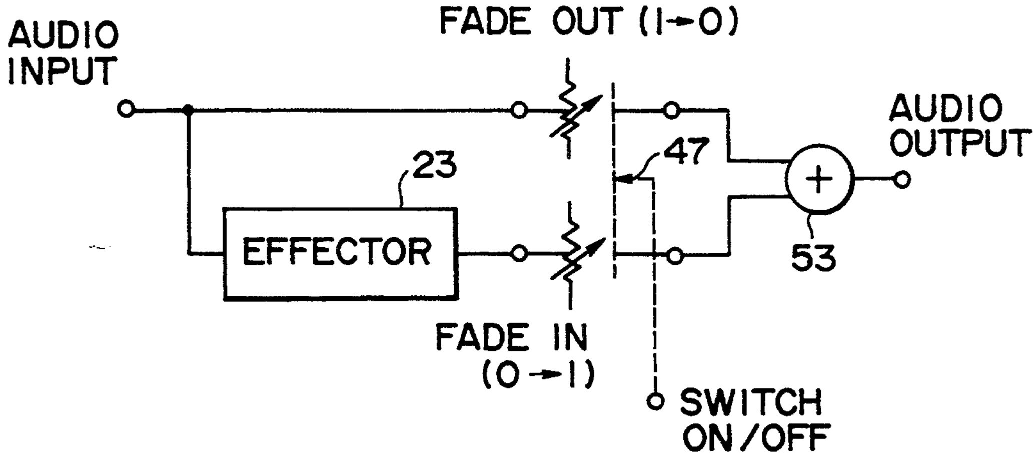
FIG. 8 is a block circuit diagram illustrating an effector switching operation.

Thus, an effector switching circuit employed in the present digital mixer performs switching to an effector 23 not by means of a simple change-over switch but in a cross fading manner as shown in FIG. 8.

Figure 11A:
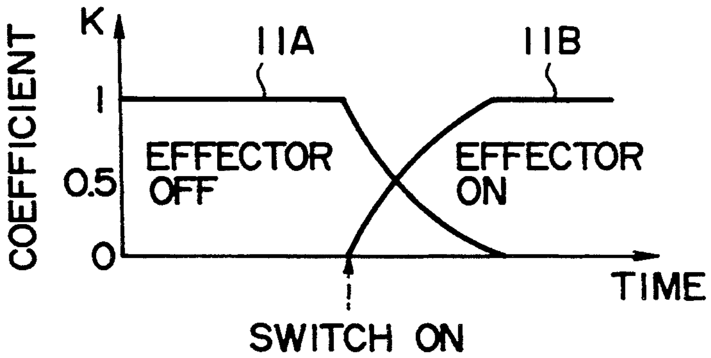
FIG. 11(A) and 11(B) are waveform diagrams illustrating operation of the effector switching circuits of FIGS. 9 or 10.

FIG. 11(A) illustrates a variation of a signal when the effector is changed over in a cross fading manner. If the effector is rendered operative (corresponding to switching on), then a signal (11A) which bypasses the effector fades out gradually as shown in FIG. 11(A) while another signal (11B) having passed through the effector gradually fades in. The time constant for such cross fading is 3 ms to 5 ms.

Figure 11B:
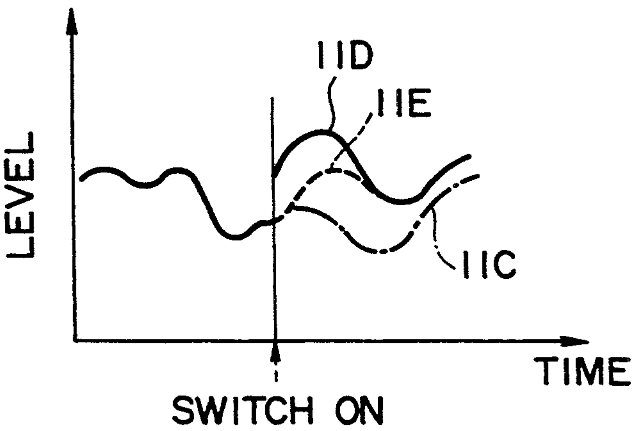

Meanwhile, FIG. 11(B) illustrates actual variations of an audio signal when cross fading is used and when cross fading is not used. First, when cross fading is not used and the signal is not changed, the input signal is outputted as it is (11C). On the other hand, when changing over is performed simply by means of a switch as in the conventional arrangement, a discontinuous wave form (waveform 11D) is obtained as described hereinabove, but if the effector is changed over with cross fading as described above, a gradual transition between a signal obtained when the effector is on and another signal obtained when the effector is off occurs as seen from FIG. 11(A), and a signal (waveform 11E) which has no point of discontinuity is obtained.

Figure 9:
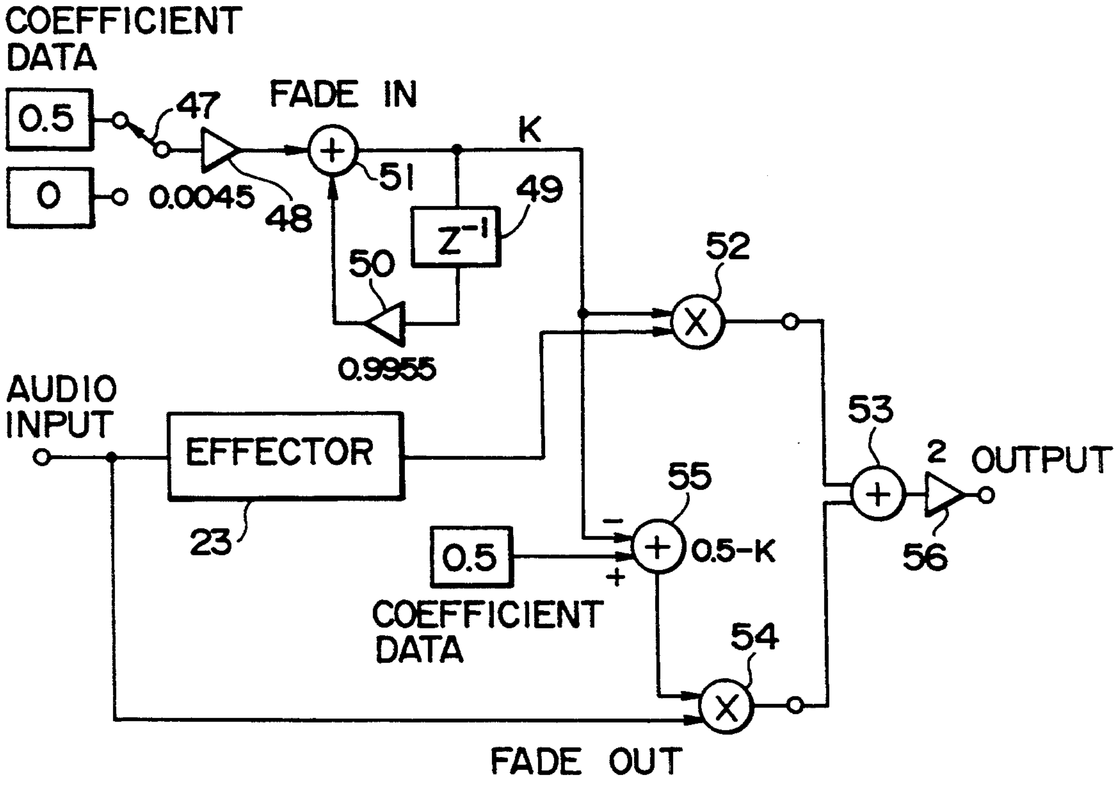
FIG. 9 is a block diagram showing an effector switching circuit.

FIG. 9 shows an exemplary construction of the effector switching circuit wherein cross fading is provided by processing in a DSP. Referring to FIG. 9, fading in and fading out are performed in the following manner in the DSP. When a cross fading switch 47 is off, the coefficient data "0" is inputted to a coefficient multiplier 48 having a multiplication coefficient of 0.0045. When the output of the effector 23 is to be faded in, the coefficient data "0.5" is inputted to the coefficient 48, and output data from the coefficient multiplier 48, and a signal delayed for one sample period by a one sample delay circuit 49 and then multiplied by a coefficient 0.9955 at a coefficient multiplier 50, are added by an adder 51. The fade in coefficient data k processed in this manner gradually increases as an exponential function. The coefficient data k is multiplied by the output of the effector 23 at a multiplier by 52 and the result is inputted as a fade in signal to another adder 53.

Meanwhile, the digital audio signal is also inputted to a multiplier 54 while coefficient data "0.5" is added to the coefficient data k by an adder 55 and fade out coefficient data (0.5−k) provided from the adder 55 is inputted to the multiplier 54, at which it is multiplied by the digital audio signal. Consequently, the digital audio signal fades out exponentially. The fade out audio signal is inputted to the adder 53 and mixed with the signal to which the effector has been applied, and the mixed output from the adder 53 is doubled by a coefficient multiplier 56 and is outputted as an output of the effector switching circuit.

Figure 10:
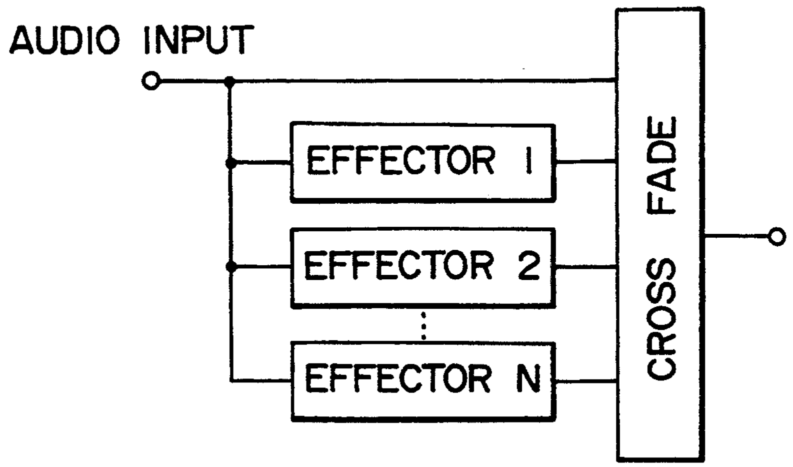
FIG. 10 is a block diagram showing another effector switching circuit.

Meanwhile, when a plurality of effectors are provided in a parallel connection as shown in FIG. 10, switching among the plurality of effectors, including switching between a signal which has not passed through an effector and a signal which has passed through the effector N, or between the effector 1 and the effector N, etc. can be performed without production of noise if such switching is performed by cross fading. Also, such switching can actually be performed so that a cross fade on/off instruction is communicated to the DSP and cross fading processing is performed within the DSP.

If the cross faded effector is adopted for a digital mixed used for video editing, it can be operated under the control of a video editor or a like apparatus. When the cross faded effector is controlled by a video editor, it is a common practice that a large number of patterns of effects and so forth are stored in advance in a snapshot memory and that a stored snapshot number is recalled. Thus, it sometimes occurs that, when fader values, parameters for the effectors such as equalizers and filters and so forth are stored for the 16 input channels (CH1 to CH16) of the digital mixer shown in FIG. 1, and then a snapshot is recalled, the parameters for all of the effectors for the 16 channels are varied at the same time. In such a case, the possibility that audio data may become discontinuous increases as compared with the case wherein only one effector is involved. Further, when an effector is operated manually, in most cases, a boost amount or the like is increased or decreased gradually. However when an effector is switched on or off using a snapshot, in almost all cases, a predetermined parameter is recalled, and accordingly, upon reproduction of a scene, the operation of gradually increasing the amount of the effect cannot be performed. In contrast, a cross fading operation as in the present digital mixer is particularly effective with a snapshot.

Insertion

As described hereinabove, the optimum input and output levels of an insertion circuit depend upon how the operator utilizes the insertion circuit.

Therefore, in an insertion circuit employed in the present digital mixer, insertion of a signal is performed while the signal remains in the form of a digital signal. This is because, once the signal is converted into an analog signal, full digital processing cannot be performed for the analog signal, and there is the possibility that processing with a high degree of accuracy cannot be performed.

Further, in the present insertion circuit, the input and output levels of a signal to be inserted can be set by the user. This is because, even if an input level is outputted without change from the insertion circuit or is outputted while being held at an internal level (i.e., a level decreased by an amount corresponding to head room), clipping is produced or a sufficient S/N ratio cannot be obtained. To prevent this, the input and output levels are varied by the user. For example, when an external effector 59 (FIG. 12) is an equalizer or the like which provides a gain, it is necessary to lower the level of an output from the insertion circuit. Or, when the external effector is a limiter or the like, which does not provide a gain, in order to assure a high S/N ratio, the signal is boosted to an appropriate level to provide an output from the insertion circuit. In this manner, the level of an output from the insertion circuit can be varied freely based on judgment of the operator. Accordingly, clipping such as described above can be prevented and a sufficiently high S/N ratio can be obtained. The range of level variation to be performed by the operator is set between the equalizer input internal level (−30 dB) and the input level (0 dB).

Figure 12:
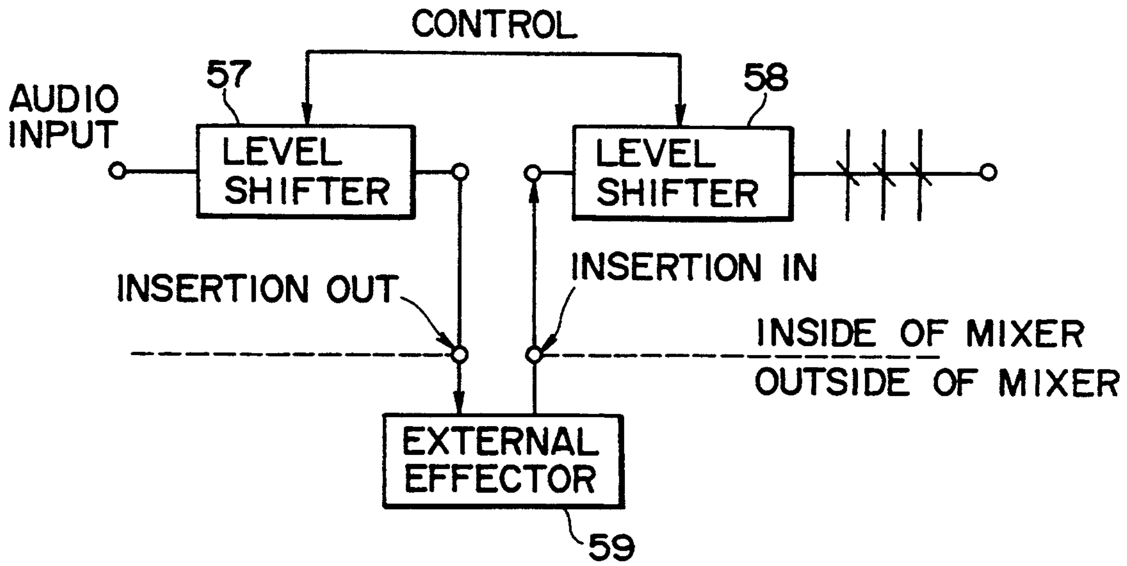
FIG. 12 is a block diagram showing an insertion circuit.

FIG. 12 shows an insertion circuit employed in the present digital mixer. Referring to FIG. 12, when insertion of an effector is to be performed, the operator will determine the level of an insertion out signal by means of an insertion out level shifter 57 provided in the mixer for shifting the level of an input signal. It is assumed that the mixer receives an insertion in signal at the level of an insertion out signal, and to this end, the mixer includes an insertion in level shift 58. If the level shifters 57 and 58 are interconnected so as to automatically set the levels of an insertion out signal and an insertion in signal, then the operator can readily achieve insertion of a desired effector.

Figures 13A, 13B:
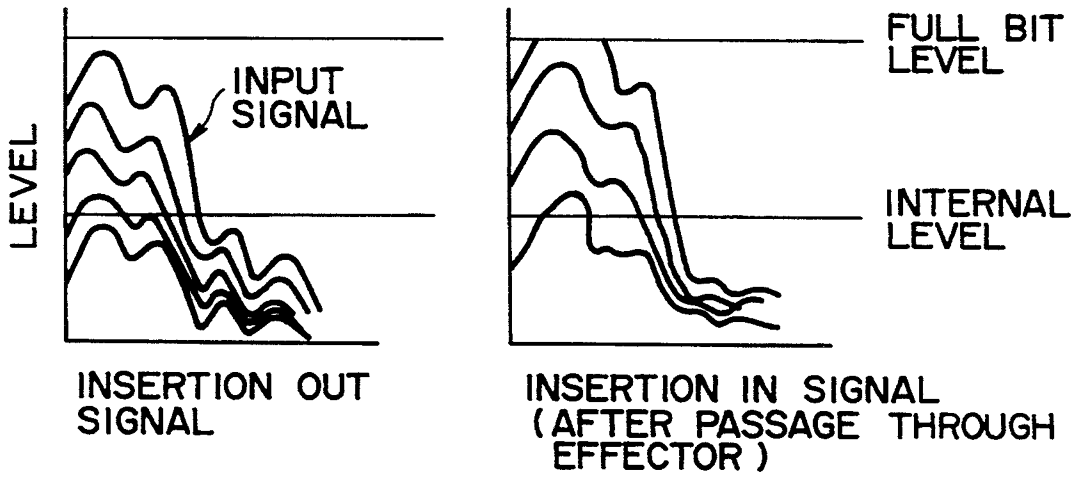
FIGS. 13(A) and 13(B) are waveform diagrams illustrating operation of the insertion circuit of FIG. 12.

If the level of an insertion out signal can be varied freely by the operator in this manner and the insertion out signal level is gradually lowered from the input signal as seen in FIG. 13(A), then the insertion in signal will not exceed the full bit level as seen in FIG. 13(B), and consequently, clipping can be prevented.

Variation of Parameters in the Mixer

In a conventional mixer, when inputs received by way of the routing switcher 2 are inputted, if the setting of the routing switcher 2 is varied, then the settings of parameters for the channels CH1 to CH16 of the mixer must also be varied.

Accordingly, in the conventional mixer, if the channels are changed, then the channel parameters must necessarily re-set. Thus, in the present digital mixer, setting of parameters is performed not for the channels CH1 to CH16 provided at the output of the routing switcher 2 as in the conventional mixer, but rather for the inputs to the routing switcher 2.

Figure 1:
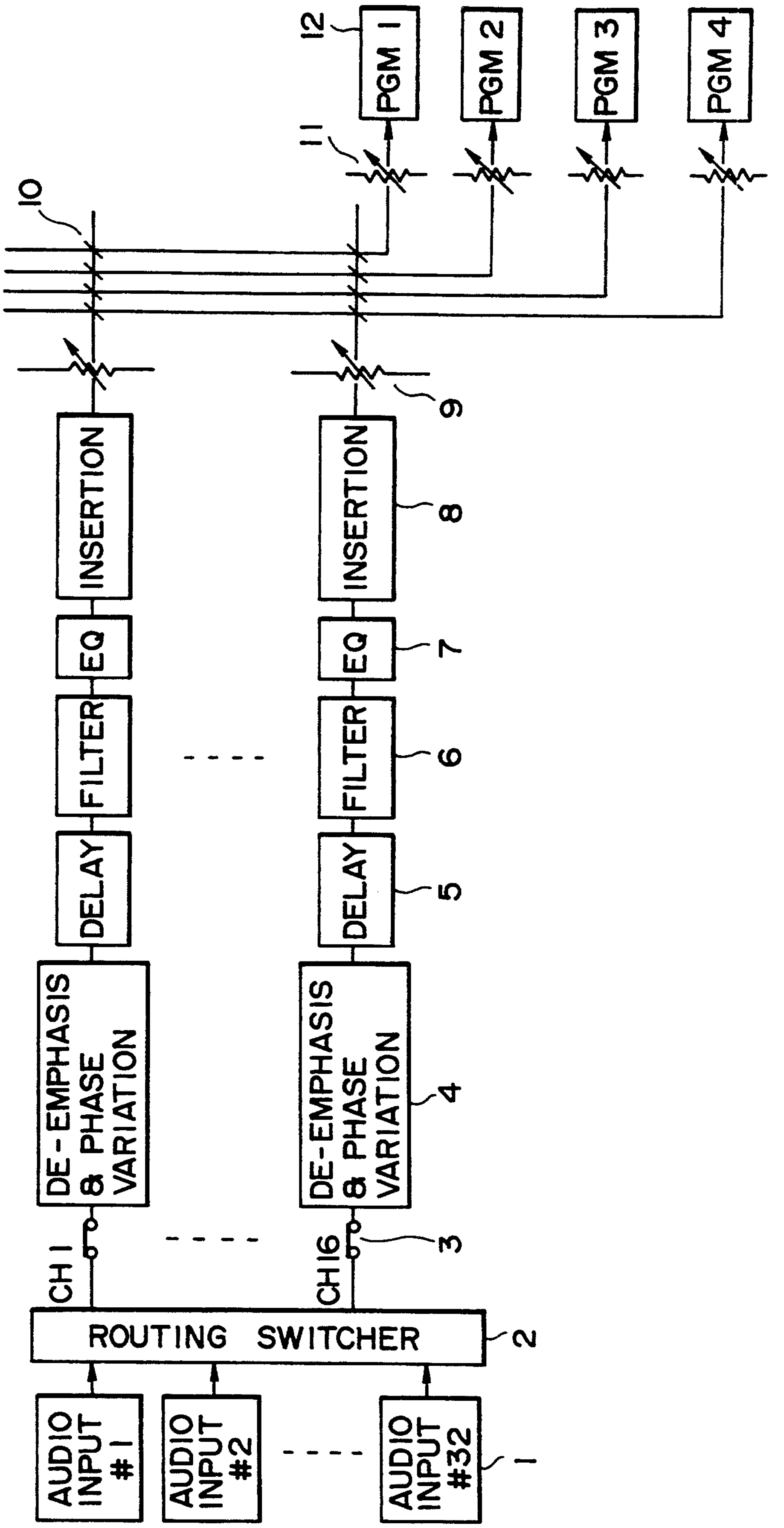
FIG. 1 is a block diagram showing the overall arrangement of a digital mixer to which the present invention can be applied.

In the case of the digital mixer of FIG. 1, inputs to the routing switcher 2 are in 32 channels while the outputs are in 16 channels, and accordingly as shown for example in FIG. 15 twice the quantity of scene setting data is provided. Looking at the scene setting data for the routing switcher 2, the values of parameters are varied for the channels CH1 to CH16 by the CPU 19.

The parameter setting in the present digital mixer will be described in more detail. It is assumed that, as an example, audio input #3 is selected for channel CH1 by the routing switcher 2. In this instance, it is assumed that the scene data of FIG. 15 are recalled as a snapshot. Then, the parameters for the channel CH1 are varied in accordance with the data for the audio input #3. Setting of the scenes can be performed by referring to signals corresponding to the audio inputs #1 to #32 selected by the routing switcher 2 for input to the channels CH1 to CH16. Meanwhile, as another example, if the audio input #1 is selected by the routing switcher 2 for input to all of the channels CH1 to CH16 and if the scenes of FIG. 15 are recalled, then the values for all the channel parameters are set to the values for the input audio #1.

Figure 14:
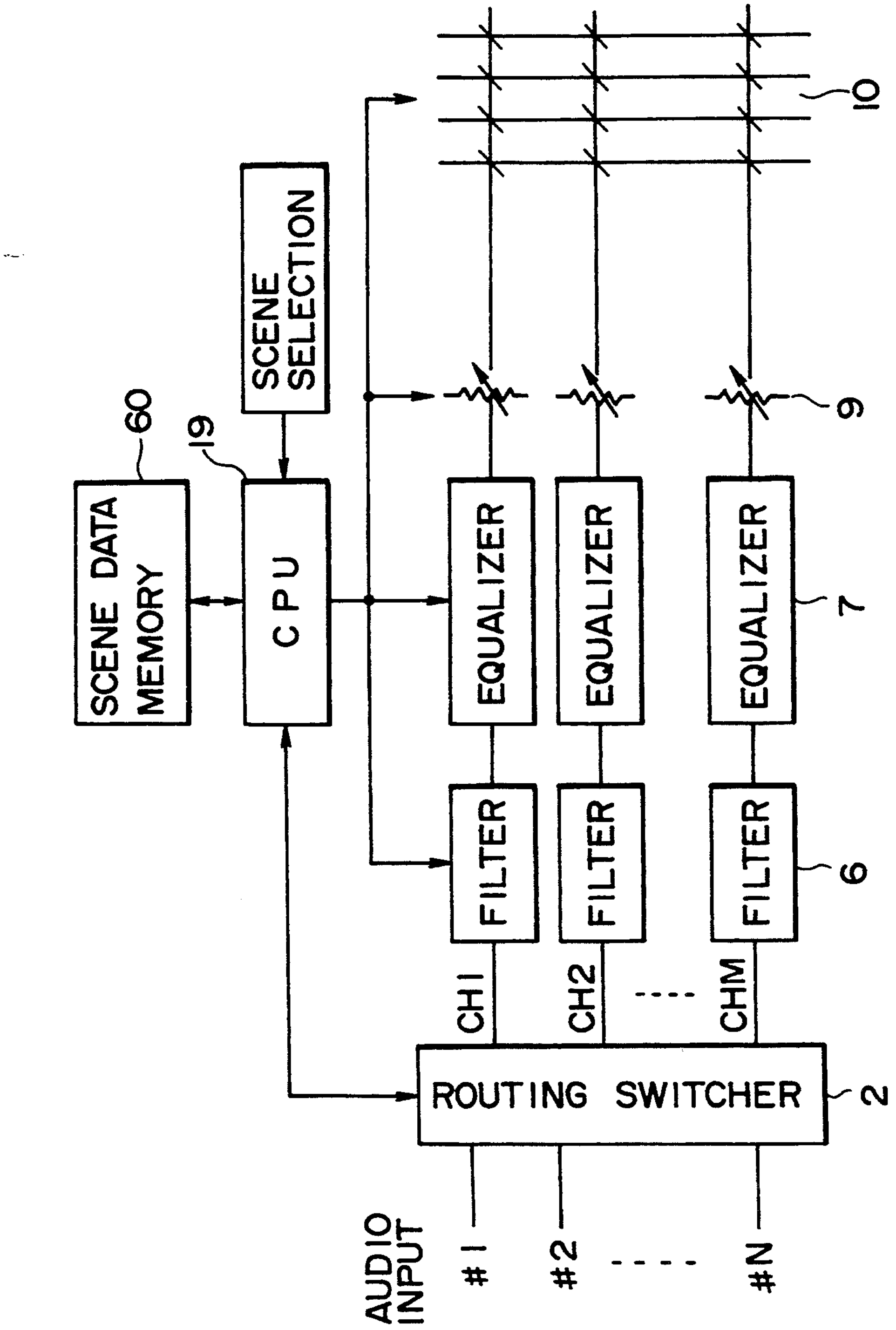
FIG. 14 is a block diagram showing a parameter setting circuit.

FIG. 14 shows the overall arrangement of a digital mixer which effects setting of parameters for inputs of the routing switcher 2. Referring to FIG. 14, digital audio input signals #1 to #N are inputted to the routing switcher 2, from which digital audio signals of M channels CH1 to CHM are outputted. The digital audio signals successively pass through effectors such as filters 6 and equalizers 7 and through channel faders 9 and are added onto mixing buses by way of assignment switches 10.

After a scene number and a setting for the routing switcher 2 are selected by the operator, a CPU 19 recalls scene data selected from a scene data memory 60 and stores set parameters for the routing switcher 2 and the input channel number therein. If the input #x ($1 \leqq X \leqq N$) is routed to the mixer input channel CH1, then the CPU 19 performs setting of parameters for the input #x to the filter 6, the equalizer 7, the fader 9 and the assignment switch 10 of the channel CH1 in accordance with the routing. In short, variation of parameters can be performed in accordance with one of the inputs #1 to #N which constitutes the source, and even when $M > N$, it is not necessary to vary the set parameters of the channels from CH1 to CHM each time the routing switcher 2 is changed over.

An operation for setting of channel parameters will be described in more detail and in comparison with the conventional arrangement. In a mixer having a routing switcher 2 at the input thereof, snapshot automation is conventionally performed for a selected signal, but in the present digital mixer, parameters can be varied for a signal before it is selected as described hereinabove.

Where this technique is employed, if it is desired to apply an effect such as a telephone sound, for example, to the audio input signal #1, and if there is a snapshot at which such a parameter can be set, then in a conventional arrangement, such snapshot is performed for the channels CH1 to CH16, and a setting for achieving a telephone effect is recalled for the appropriate channel.

Accordingly, if an effect based on scene data for a telephone is provided for the channel CH2, then the audio input signal #1 to which such effect is desired to be applied must be selected to the channel CH2 without fail.

As a result, in actual operation, the audio input channel #1 must be reassigned to a channel to which a telephone effect is applied. In this instance, the operator must know to which channel a desired effect is applied.

On the other hand, in the present digital mixer, since a snapshot recall is performed for the audio input signals #1 to #32, if the signal to which a telephone effect is desired to be applied is the audio input signal #1, then a scene wherein the effect is applied to the audio input signal #1 can be recalled. Accordingly, a scene can be recalled and the telephone effect can be applied to whatever channel for which the audio input signal #1 is selected. In short, if effects to be applied to the audio input signals #1 to #32 are provided for the individual scenes in advance, then the operator is required only to recall a snapshot, but is not required to re-select inputs for the individual channels.

Output Level Indicating Apparatus for the Mixing Console

There will now be described an indicating apparatus for a mixing console that is suitable for use with the digital mixer described above or with the mixer proposed in Japanese published Patent Application No. 2-47125. The mixer includes, as described hereinabove with reference to FIG. 17, a processor rack 26 for processing data, and a control panel 27 for providing a man-machine interface. Data for indicating sound volume/sound quality data on the meter 28 provided on the control panel 27 is produced from data corresponding to the four external outputs PGM1 to PGM4 described hereinabove.

Figure 20:
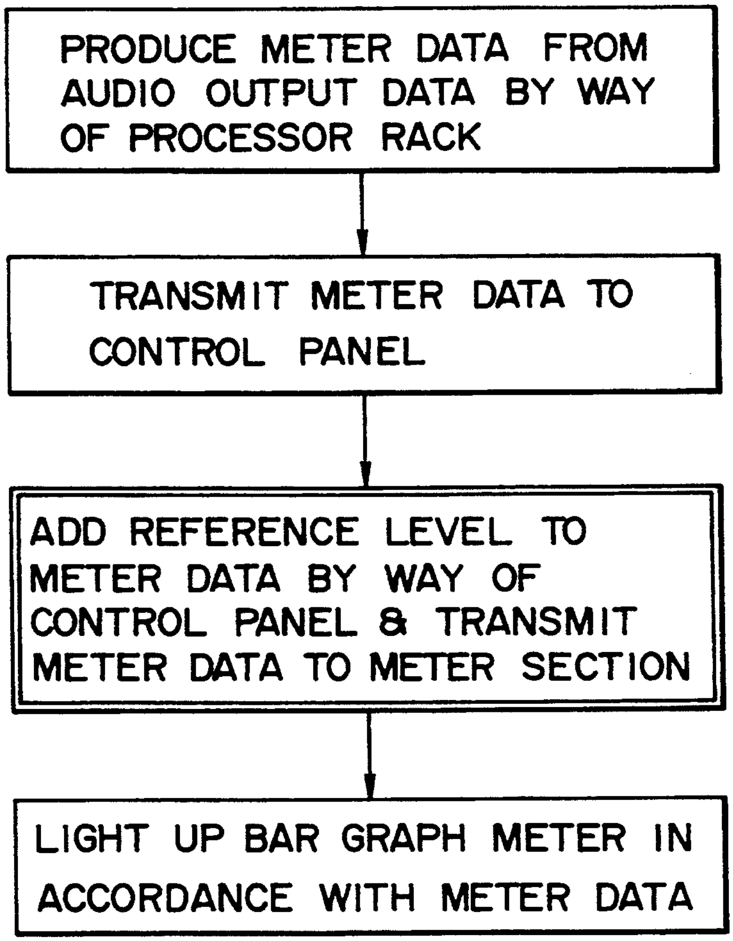
FIG. 20 is a flow chart illustrating output level indicating operation for the bar graph meter of the mixing console shown in FIG. 17.
Figure 21:
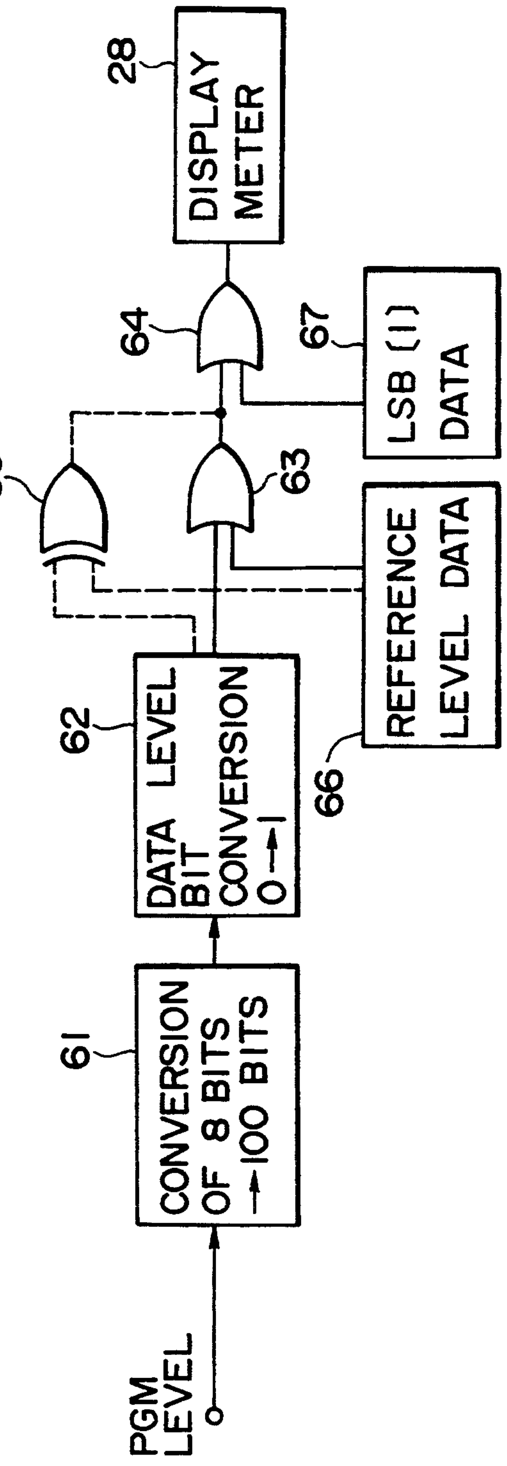
FIG. 21 is a block diagram showing a bar graph meter output level indicating circuit.

The indication provided on the meter 28 represents not the PGM meter data per se but rather is shown in units of dB. As seen from the flow chart of FIG. 20, meter data to be indicated on the meter is produced by the processor rack 26.

The mixer of FIG. 1 is an audio mixer of the full digital processing type, and accordingly, the meter data also is digital data. For the meter 28, typically a bar graph meter of the 100 segment type is employed, and the meter data is 8 bit data.

Figure 32:
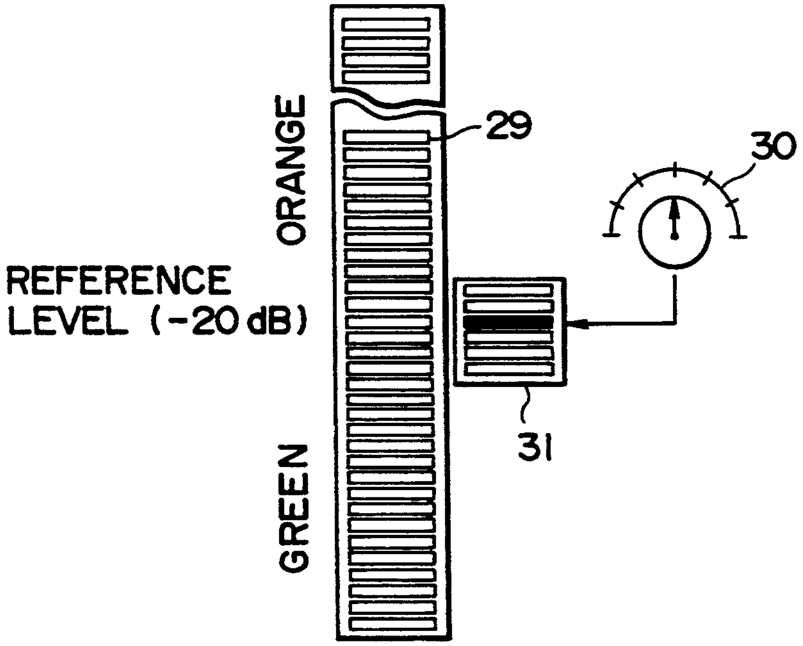
FIG. 32 is a diagrammatic view illustrating a conventional output data indication by a bar graph meter.

In a conventional meter indication, the reference level is not typically added to the meter data by the control panel 27 and then sent with the meter data to the meter section as seen from the flow chart described hereinabove, rather the audio output data is produced by the processor rack 26 and the meter data is transmitted to the control panel 27 so that the bar graph meter is lit in accordance with the meter data while an indication of a reference level is performed by changing the color of those segments 29 that are higher than a reference level. Alternatively, a reference level setting knob and another bar graph meter may be used to indicate a reference level as shown in FIG. 32.

Such methods, however, are disadvantageous in that the meter indication and the reference level indication are not easily read together, and the latter method complicates the hardware because the additional bar graph indication is involved.

The present output level indicating apparatus solves the problem described just above, and a method of producing meter data to be indicated on the meter will be described first with reference to FIGS. 18(A) to 18(C), 19(A) and 21.

An indication on the segment indication meter 28 shown in FIGS. 18(A) to 18 (C) for a reference level set at −210 dB and audio data corresponding to −30 dB and −10 dB will be described below. Further, it is assumed that, among the 100 segments of the bar graph meter, the 20th segment from the bottom is lit to indicate the reference level of −20 dB (FIG. 18(A)); the tenth segment from the bottom is lit to indicate the audio data corresponding to −30 dB (FIG. 18 (B)); and the 30th segment from the bottom is lit to indicate the audio data corresponding to −10 dB (FIG. 18 (C)).

First, 8-bit data transferred to the segment indication meter 28 from the processor rack 26 is converted at block 61 (FIG. 21) into 100-bit data. In short, since audio data corresponding to −10 dB is represented as 0a (hexadecimal notation) in 8 bits and audio data corresponding to −30 dB is represented as le, 100 bit data are produced as follows:

01=000...0000000000000000000001000000000

1e=000...100000000000000000000000000000 and in the case of 0a, the 10th bit from the LSB (least significant bit) is "1" while all the other bits are "0), and in the case of 1e, the 30th bit from the LSB is "1". Then all of the bits lower than the bit having the value "1" are converted at block 62 into "1". In short,

0a→000...000000000000000000001111111111 ..(F1)

1e→000...111111111111111111111111111111 ..(F2)

Data for indicating the reference level is added to the data resulting from this conversion.

Since the reference level is −20 dB, it is represented as 14 (hexadecimal notation), and if this is represented by 100 bits, then

14=000...00000000010000000000000000000

In this manner, the 20th bit from the LSB is "1". The two data are ORed at block 63. Consequently, meter data for −10 dB is provided as:

000...00000000010000000001111111111 and meter data for −30 dB is provided as:

000...111111111111111111111111111111

Figure 18A:
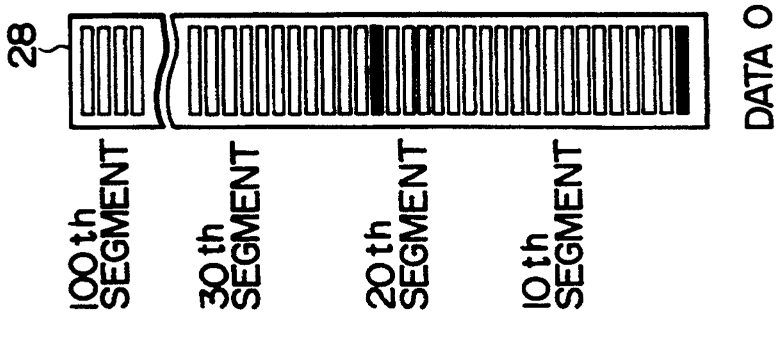
FIG. 18(A) to 18(C) are diagrammatic views showing an example of output level indications by a bar graph meter in the mixing console shown in FIG. 17.
Figure 18B:
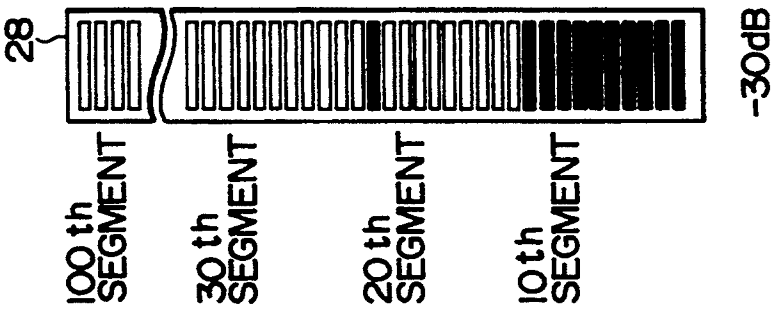
Figure 18C:
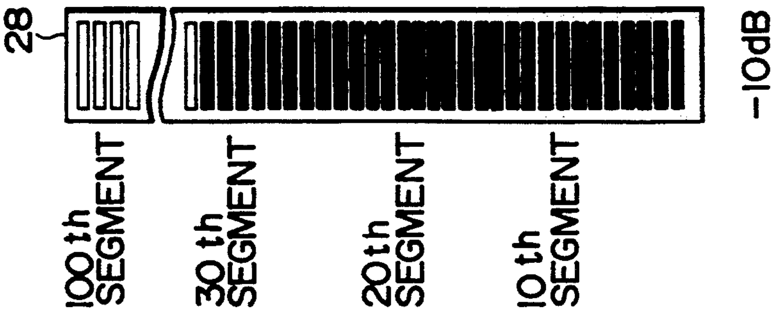

If the segments of the meter are lit in accordance with the data, then an indication of both the reference level and the audio data level at the same time, as shown in FIGS. 18(B) and 18(C), can be realized.

Meanwhile, to indicate a level of −∞ the lowermost segment (LSB) of the meter is lit, that is, the segment for the LSB is lit even when the audio data is "0) (FIG. 18(A)). In this instance, after the audio data is ORed at block 63 with the data "14" representing the reference level, the resulting data is ORed with data "01" from block. While data representing −30 dB or −10 dB levels and so forth inevitably has an LSB with the value "1" after the conversion as described above, and the data "01" need not be ORed with such data, it is still necessary to perform the operation described above in order to light the segment for the LSB 67 when the data value is 0. Alternatively, the hardware may be so arranged that the segment for the LSB is always lit.

Figure 19A:
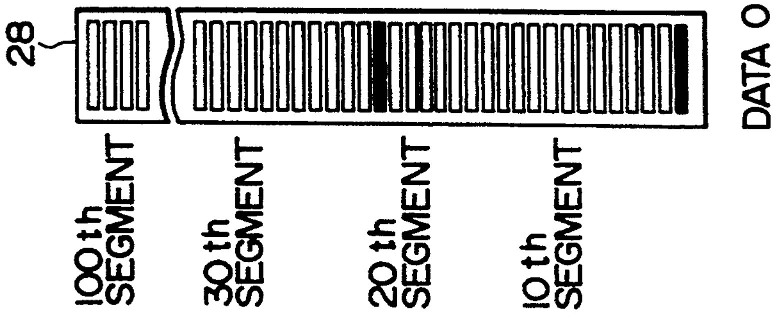
FIG. 19(A) to 19(C) are similar views but showing another example of output level indications by the bar graph meter of the mixing console shown in FIG. 17.
Figure 19B:
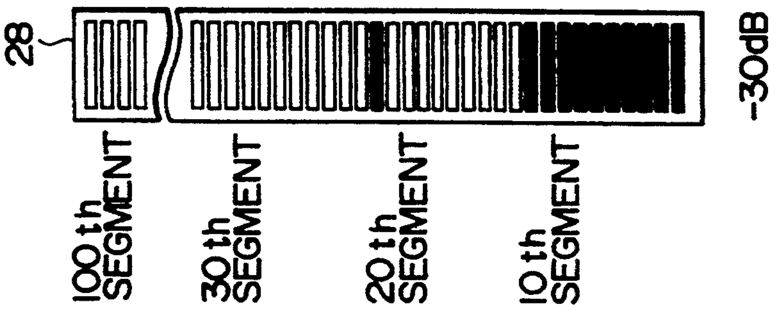
Figure 19C:
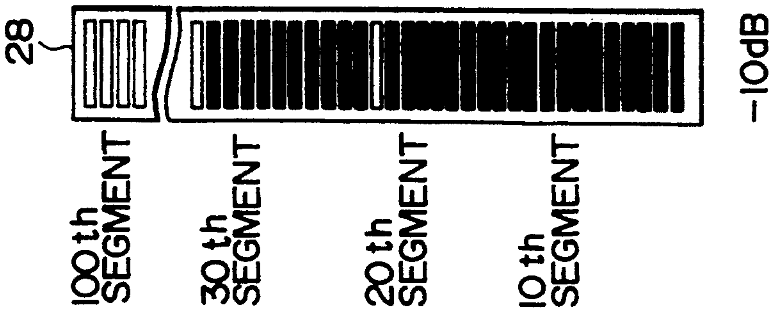

On the other hand, as another in which the indicator may be lit, if reference level indication data is not ORed at block 63 but instead is exclusively ORed at block 65, then even if the audio level is higher than the reference level, the reference level (−20 dB) can still be displayed as seen from FIGS. 19(A) to 19(C). The control panel 27 includes a setter (not shown) by means of which the reference level indication data 66 can be set to whatever value the user desires.

Self-Diagnosis by the Mixer

For the mixer as described above, maintenance is required and it is necessary to check the functioning of the circuit blocks of the mixer. If the mixer does not include a self-diagnosing system which checks the functioning of the circuit blocks, particularly of the DSPs and so forth which perform the digital processing, then audio signals at all of the outputs must be checked while inputting audio signals to all of the inputs. Even if the digital mixer includes a self-diagnosing system, if the mixer does not indicate a reference number for the DSPs or integrated circuits making up the mixer, then measurements must be performed using measuring instruments or the like.

Figure 22:
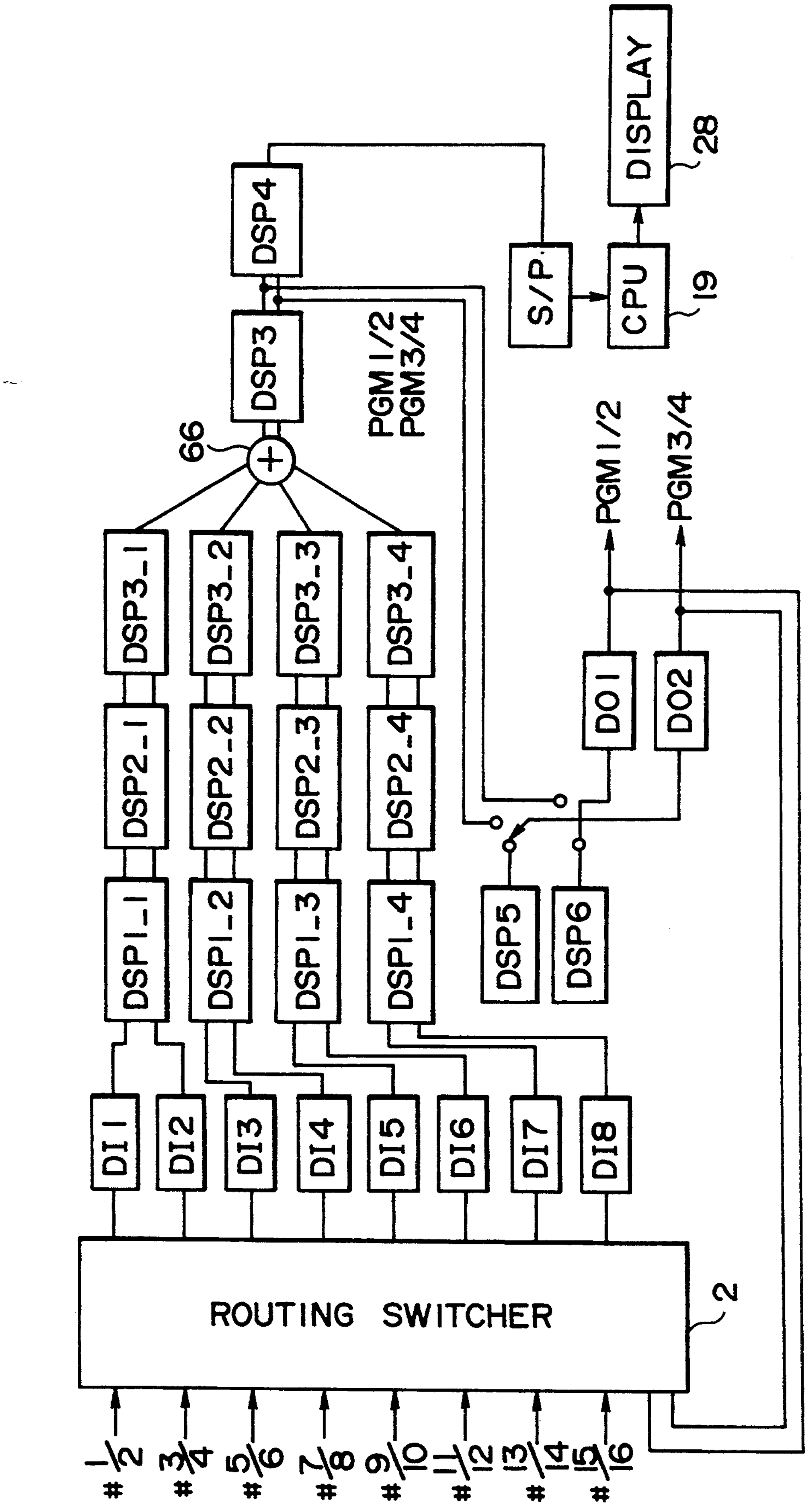
FIG. 22 is a block diagram of a mixer having a self-diagnosis function according to the present invention.
Figure 23:
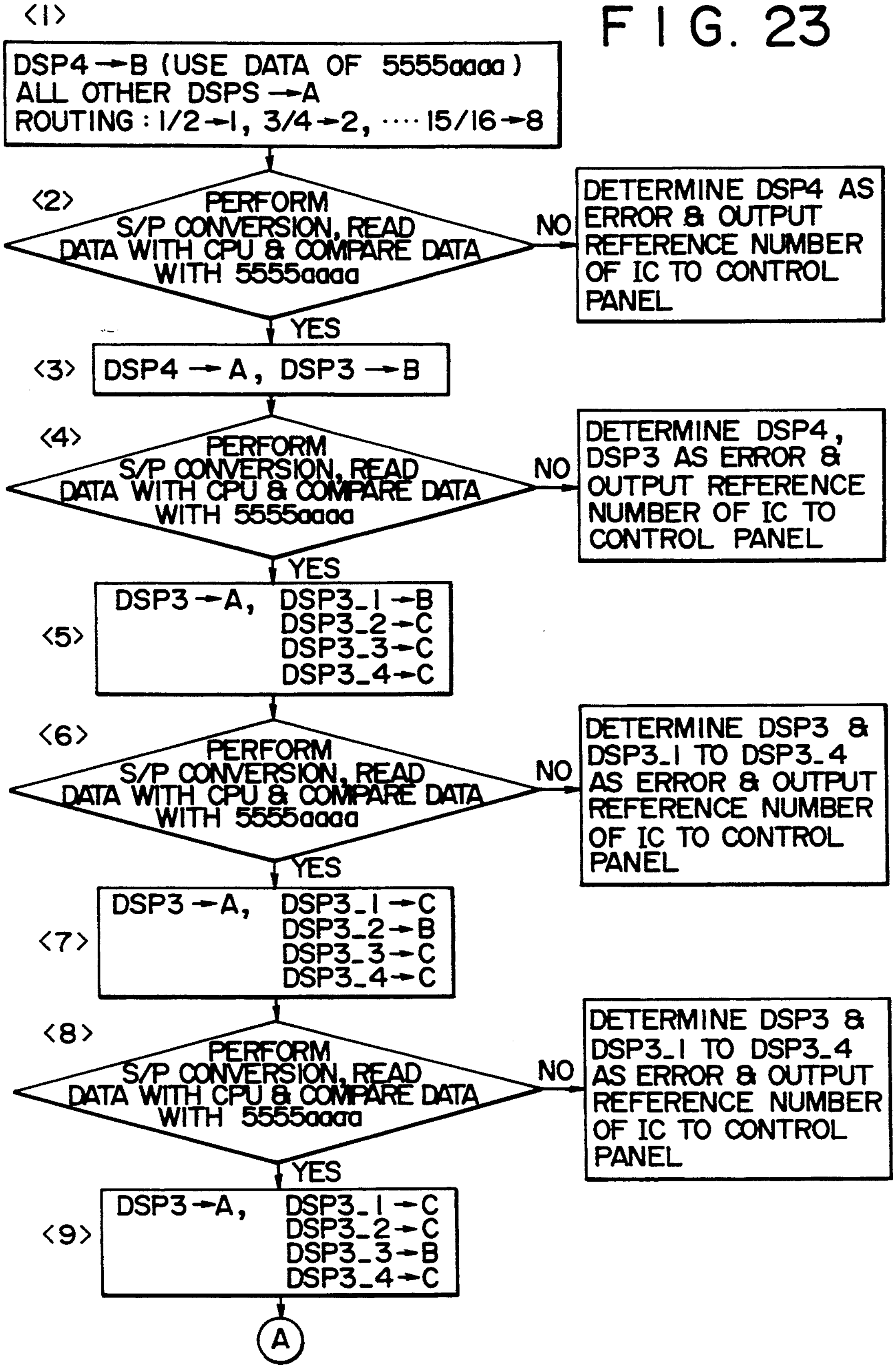
FIGS. 23 to 27 are flow charts illustrating a self-diagnosing procedure carried out by the mixer of FIG. 22.
Figure 24:
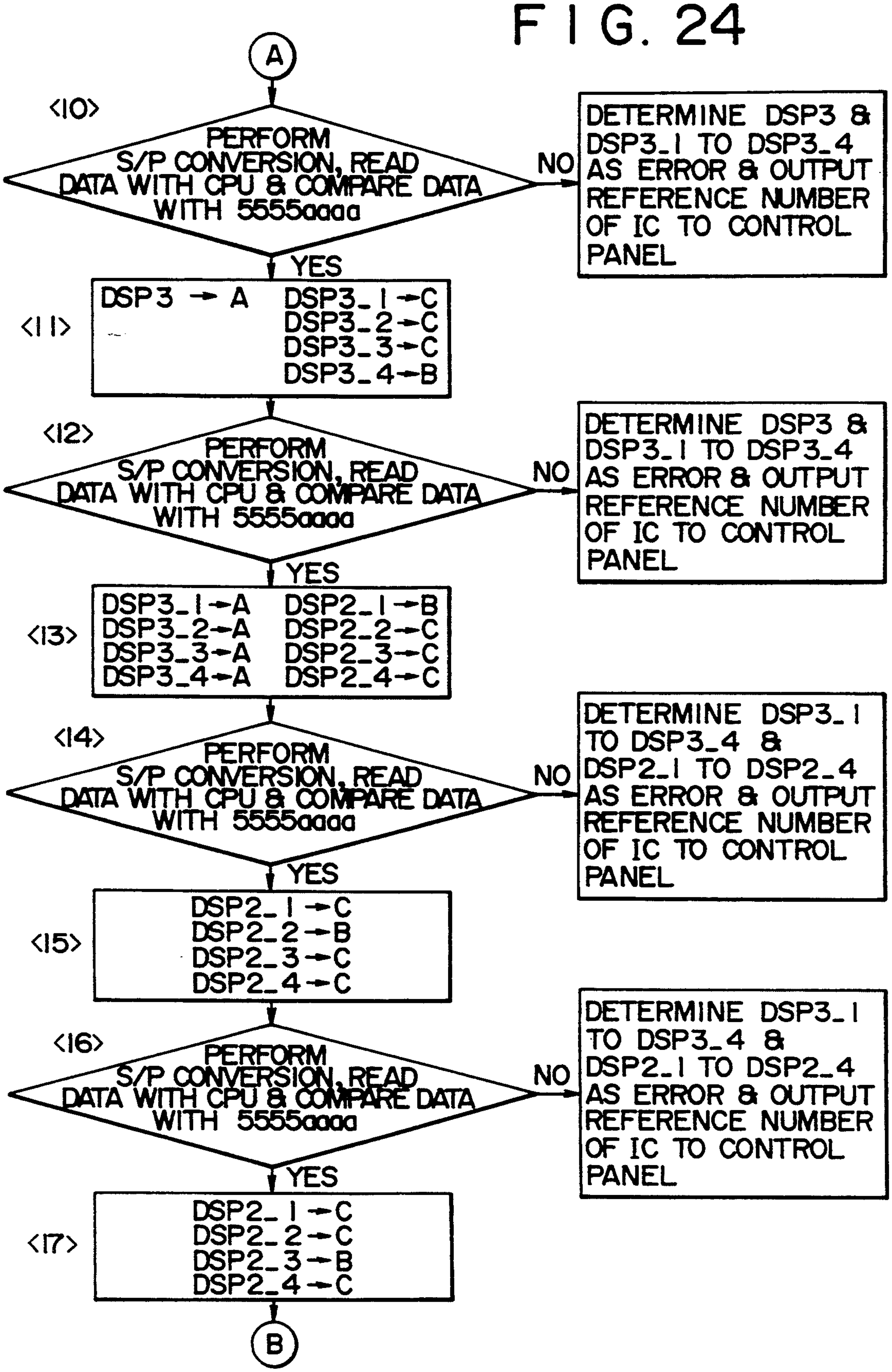
Figure 25:
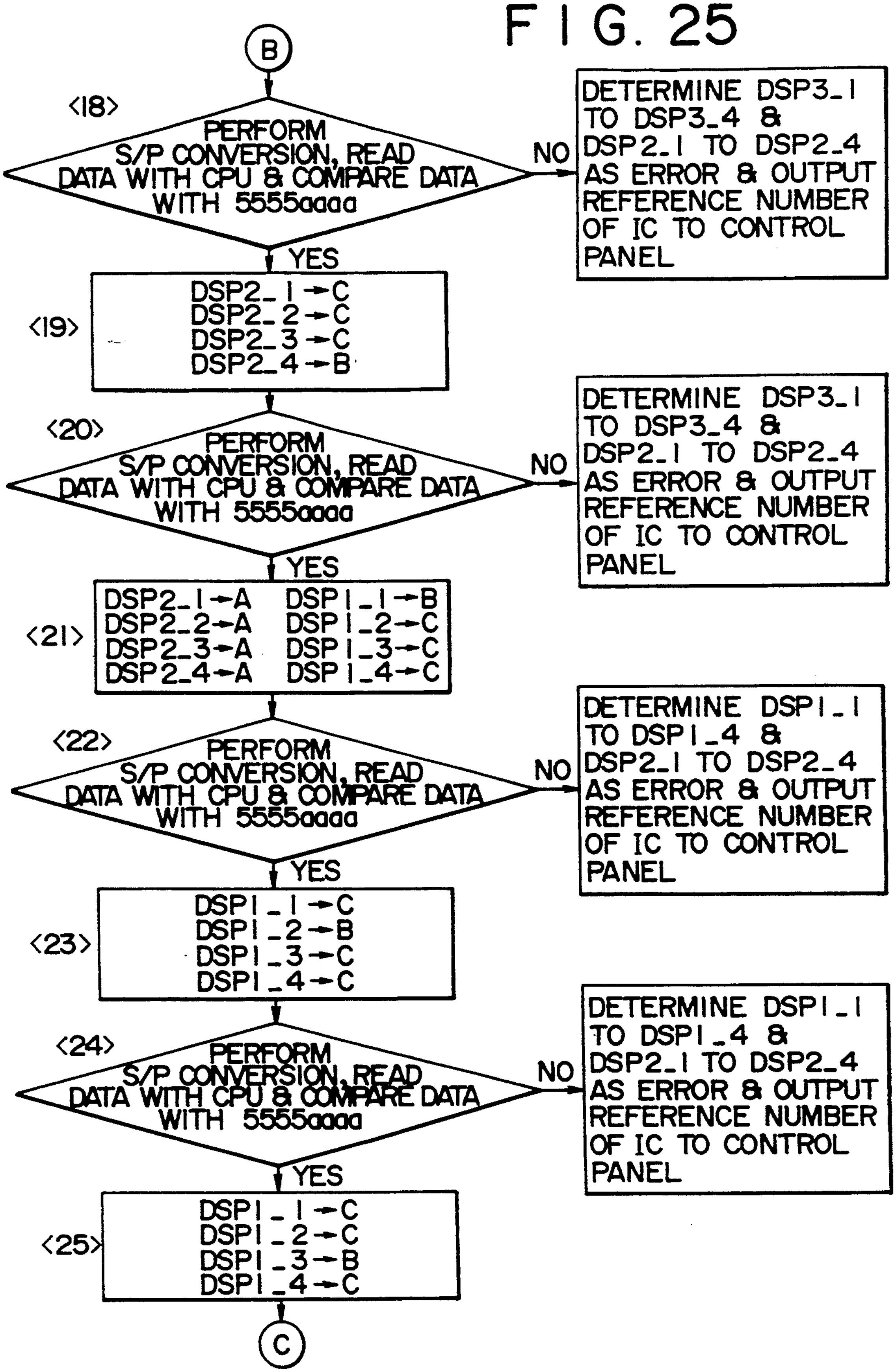
Figure 26:
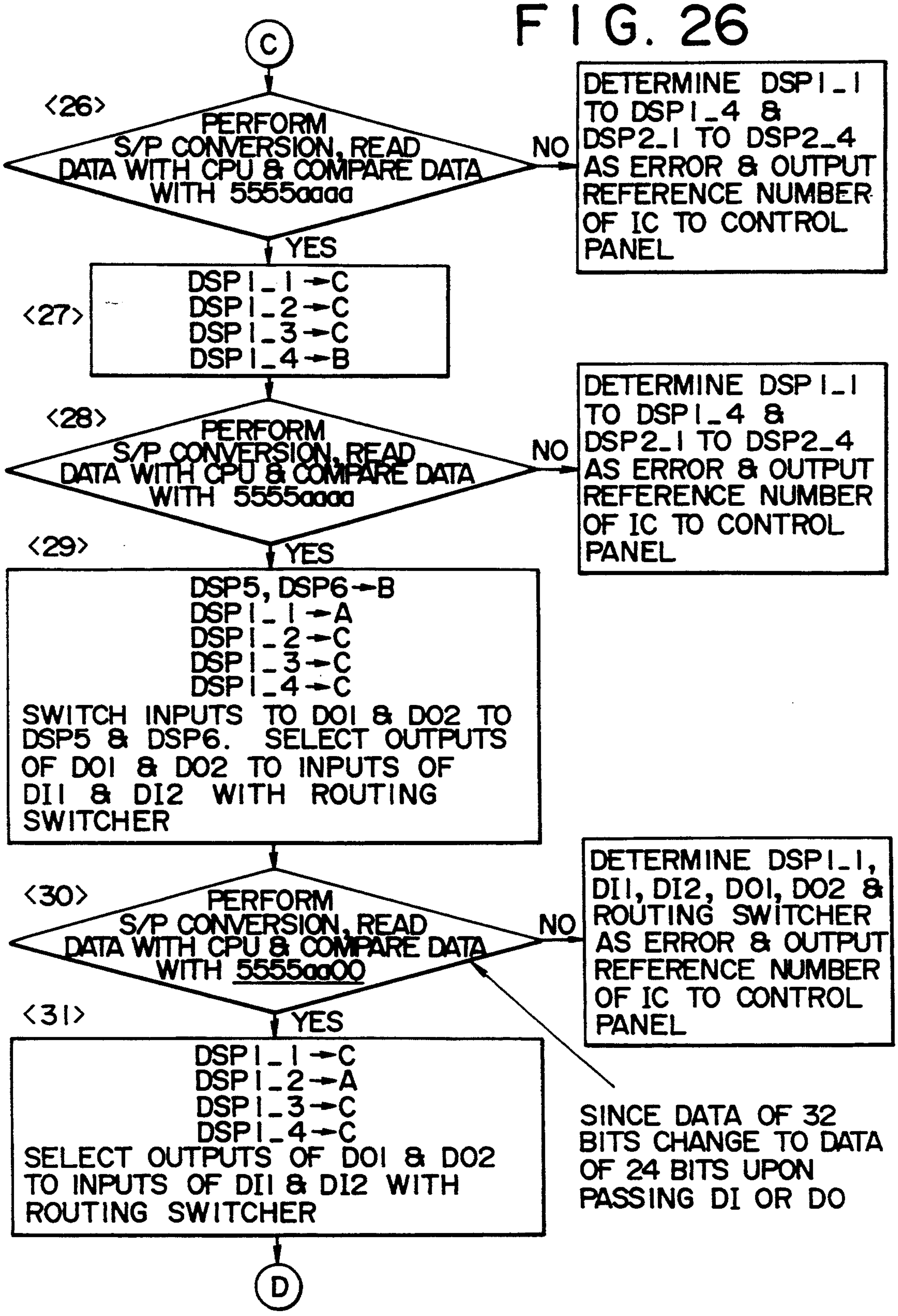
Figure 27:
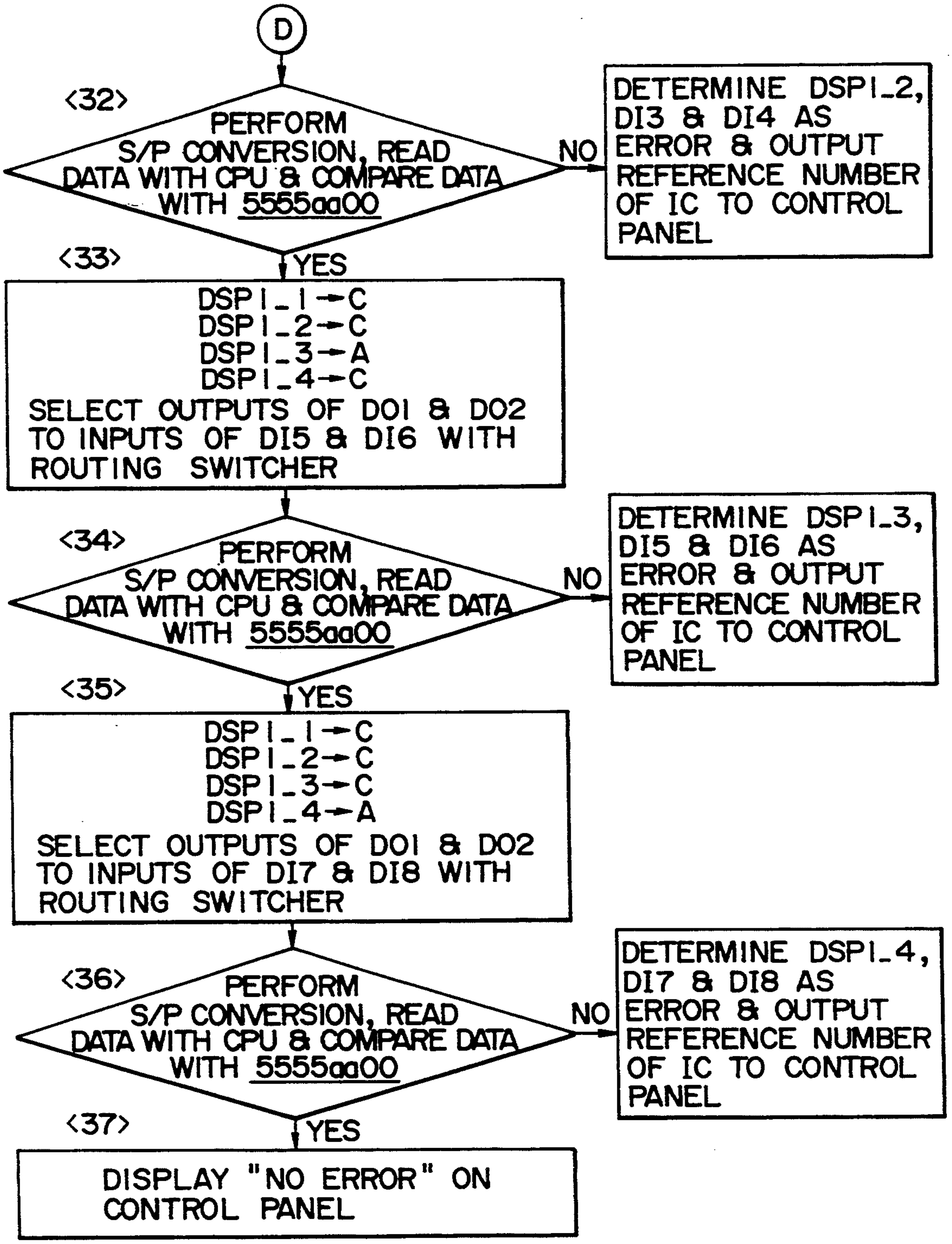
Figure 28A:
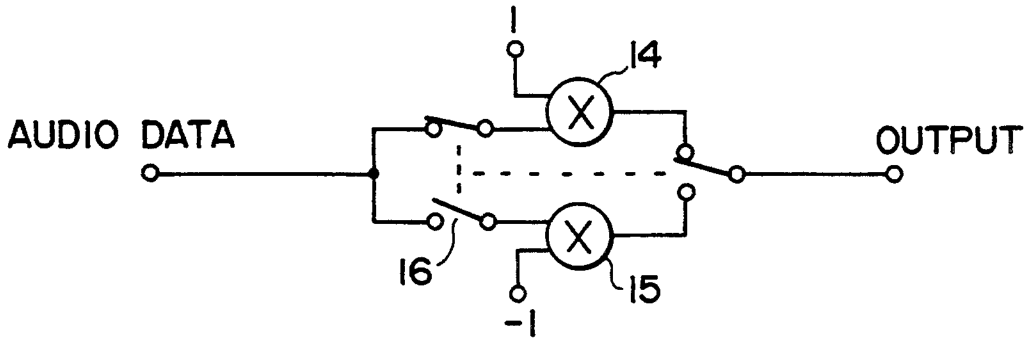
FIG. 28(A) is a circuit diagram of a conventional phase variation circuit and FIGS. 28(B) and 28(C) are diagrams illustrating operation of the phase variation circuit of FIG. 28(A)
Figure 28B:
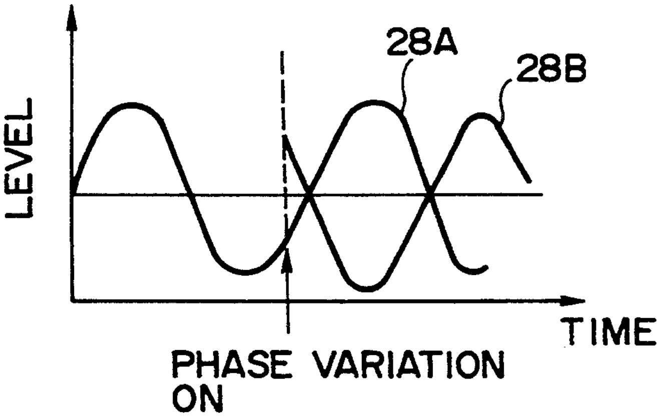
Figure 28C:
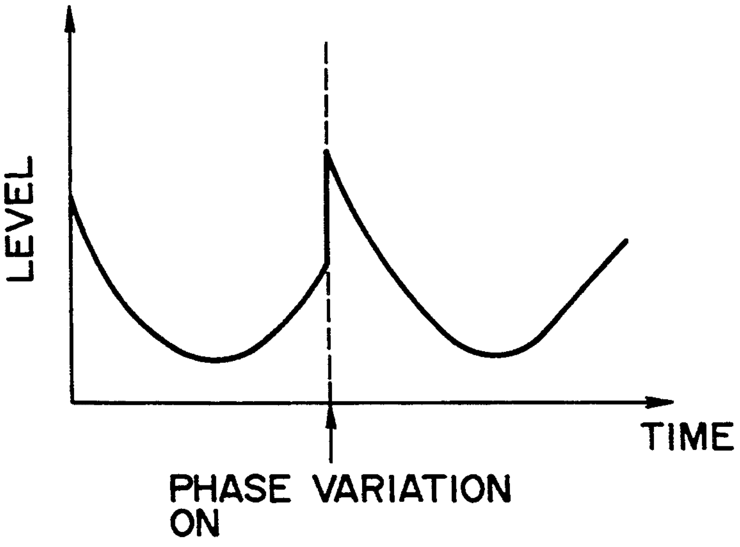

FIG. 22 shows in detail the arrangement of the digital mixer according to the present invention. Referring to FIG. 22, in the arrangement shown, digital audio signals in 16 channels are inputted to a routing switcher 2. That is, eight stereo signals ranging from the digital audio signal #½ to the digital audio signal #15/16 are provided as inputs to the routing switcher 2.

Signals selected by the routing switcher 2 are demodulated by AES/EBU demodulating ICs DI1 to DI8, the outputs of which are inputted to digital signal processors (DSPs) DSP1_1 to DSP_4, respectively. Further, the outputs of the DSPs DSP1_1 to DSP1_4 are inputted to DSPs DSP2_1 to DSP2_4, respectively. Those DSPs execute processing to realize equalizers, filters delay units and so forth. The outputs of the DSPs DSP2_1 to DSP2_4 are inputted to DSPs DSP3_1 to DSP3_4, respectively. The DSPs DSP3_1 to DSP3_4 execute processing to realize faders and so forth.

Signals that are transmitted through the DSPs described above are finally added by an adder 66 and then supplied to a DSP DSP3. The output signals PGM$\frac{1}{2}$ and PGM$\frac{3}{4}$ from the DSP DSP3 are inputted to a pair of modulators DO1 and DO2, respectively. The signals inputted to the modulators DO1 and DO2 are modulated into AES/EBU signals and outputted from the mixer as signals PGM1/2 and PGM3/4. Meanwhile, the signals inputted to a DSP DSP4 are converted into meter indication data by the DSP DSP4 and then converted into a parallel signal by a serial to parallel converter S/P. The parallel signal from the serial to parallel converter S/P is read by a CPU 19 and indicated on the indicator 28 of the control panel.

Further, the signals provided after conversion by the modulators DO1 and DO2 are fed back to inputs of the routing switcher 2 by way of respective loops so that self-diagnosis is performed by way of the loops.

The self-diagnosing method provided according to the present invention will now be described with reference to the self-diagnosis flow charts shown in FIGS. 23 to 27.

Figure 17:
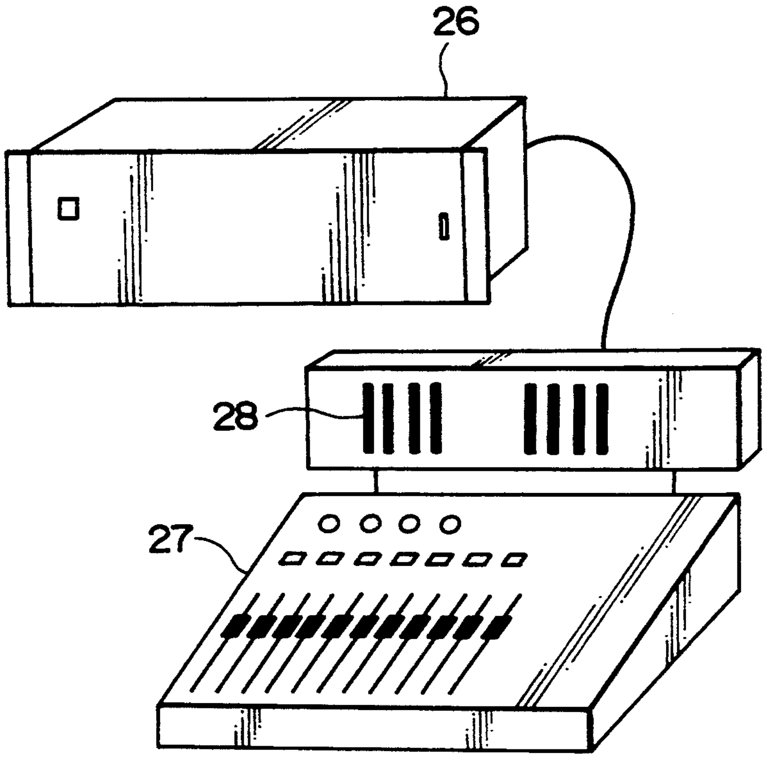
FIG. 17 is a perspective view of a mixing console.

The flow charts include processing to determine whether a DSP is in an error condition and indicating the error on the control panel 27 (FIG. 17). Such an error condition is detected when 1. DC data (5555aaaa) cannot be produced;
2. data cannot be transmitted through the device; or
3. data "0" cannot be produced.

When the condition 1 is not met, sometimes the condition 3 is not checked. Further, when the DC data referred to in the condition 1 is to be produced, functioning of the multipliers, ALUs, RAMs and so forth in the DSPs is also checked.

Accordingly, three different kinds of signal processing is carried out in each DSP to perform the self-diagnosis described in the flow charts (FIGS. 23 to 27): A. data is passed through (input=output); B. the MPY, the ALU, the RAM and so forth in the DSP are checked, and if those circuits are normal, then non-zero DC data (for example, 5555aaaa) is produced; and C. 0 is outputted.

The sequence of self-diagnosis operations will now be described in detail with reference to the flow charts.

Step 1: Data 55550000 is produced by the DSP DSP4 (processing B), and all of the other DSPs are set so that data may pass through them (processing A). Routing is such that the stereo input #$\frac{1}{2}$ is outputted to the output 1; #$\frac{3}{4}$ to the output 2; . . . , and #15/16 to the output 8.

Step 2: The data produced by the DSP DSP4 is converted from serial data into parallel data, and the parallel data is read by the CPU and is compared with data 5555aaaa generated by the CPU. If the result of comparison represents that correct data has not been received (NO), then the DSP DSP4 is determined to be in an error condition, and a reference number for the IC constituting the DSP DSP4 is outputted to the control panel.

Step 3: When the DSP DSP4 receives the data correctly (YES), the processing A is applied to the DSP DSP4 and the processing B is applied to the DSP DSP3 so that the data 5555aaaa is produced from the DSP DSP3.

Step 4: A similar determination to that step 2 is performed and when the compared data do not coincide with each other, the DSPs DSP3 and DSP4 are determined to be in an error condition, and reference numbers for the ICs constituting the DSPs DSP4 and DSP3 are outputted to the control panel.

Step 5: When the compared data coincide with each other, the processing A is applied to the DSP DSP3; the processing B is applied to the DSP DSP3_1; and the processing C is applied to the DSPs DSP3_2 to DSP3_4.

Step 6: The data is converted from serial data into parallel data, and the parallel data is read by the CPU and compared with 5555aaaa. If the data do not coincide (NO), the DSPs DSP3 and DSP3_1 to DSP3_4 are determined to be in an error condition, and reference numbers for the ICs constituting the DSPs DSP3 and DSP3_1 to DSP3_4 are outputted to the control panel.

Steps 7 to 12: The processing B is applied to the DSP DSP3_2 while the processing C is applied to the other DSPs DSP3_1, DSP3_3 and DSP3_4, and a similar determination is performed. Then, the processing B is applied successively to the DSPs DSP3_3 and DSP3_4 and a similar determination is performed, and if the data do not coincide, the DSPs DSP3 and DSP3_1 to DSP3_4 are determined to be in an error condition and the reference numbers for the ICs corresponding to those DSPs are outputted to the control panel.

Step 13: The processing A is applied to the DSPs DSP3_1 to DSP3_4; the processing B is applied to the DSP DSP2_1; and the processing C is applied to the other DSPs DSP2_2 to DSP2_4.

Step 14: The output data is converted from serial data into parallel data, and the parallel data is read by the CPU and compared with the data 5555aaaa generated by the CPU. If the data do not coincide, the DSPs DSP3_1 to DSP3_4 and DSP2_1 to DSP2_4 are determined to be in an error condition, and the reference numbers for the ICs corresponding to those DSPs are outputted to the control panel.

Steps 15 to 20: The processing B is applied to the DSP DSP2_2 while the processing C is applied to the other DSPs DSP 2_1, DSP2_3 and DSP2_4, and a similar determination is performed. Then, the processing B is applied successively to the DSPs DSP2_3 and DSP2_4 and a similar determination is performed, and in case the data does not coincide, the DSPs DSP3_1 to DSP3_4 and DSP2_1 to DSP2_4 are determined to be in an error condition and the reference numbers for the ICs corresponding to those DSPs are outputted to the control panel.

Step 21: The processing A is applied to the DSPs DSP2_1 to DSP2_4; the processing B is applied to the DSP DSP1_1; and the processing C is applied to the other DSPs DSP1_2 to DSP1_4.

Step 22: The output data is converted from serial data into parallel data and the parallel data is read by the CPU and compared with the data 5555aaaa generated by the CPU. If the data does not coincide, the DSPs DSP1_1 to DSP 1_4 and DSP2_1 to DSP2_4 are determined to be in an error condition, and the reference numbers for the ICs corresponding to those DSPs are outputted to the control panel.

Step 23 to 28: The processing B is applied to the DSP DSP1_2 while the processing C is applied to the other DSPs DSP1_1 DSP1_3 and DSP1_4, and a similar determination is performed. Then, the processing B is applied successively to the DSPs DSP1_3 and DSP2_4 and a similar determination is performed, and if the data do not coincide, the DSPs DSP1_1 to DSP1_4 and DSP2_1 to DSP2_4 are determined to be in an error condition and the reference numbers for the ICs corresponding to those DSPs are outputted to the control panel.

Step 29: The processing B is applied to the DSPs DSP5 and DSP6; the processing A is applied to the DSP DSP1_1; and the processing C is applied to the DSPs DSP1_2 to DSP1_4, and the inputs of the modulators DO1 and DO2 are changed over to the DSPs DSP5 and DSP6. Further, the outputs of the modulators DO1 and DO2 are selected to be inputs of the demodulators DI1 and DI2, respectively, by the routing switcher.

Step 30: The output data is converted from serial data into parallel data, and the parallel data is read by the CPU and compared with the data 5555aa00 generated by the CPU. The comparison data is changed to 5555aa00 because, when data passes through any of the demodulators and modulators, the data is changed from 32-bit data carried on the internal bus to 24-bit data based on the ABS/EBU format.

If the data do not coincide, the DSP DSP1_1, the demodulators DI1 and DI2, the modulators DO1 and DO2 and the routing switcher 2 are determined to be in an error condition and the reference numbers for the ICs corresponding to those components are outputted to the control panel.

Step 31: The processing C is applied to the DSP DSP1_1; the processing A is applied to the DSP DSP1_2; and the processing C is applied to the DSPs DSP1_3 and DSP1_4, and the outputs of the modulators DO1 and DO2 are selected to be inputs of the demodulators DI3 and DI4, respectively, by the routing switcher.

Step 32: A similar comparison to that at step 30 is performed, and if the data do not coincide, the DSP DSP1_2 and the demodulators DI3 and DI4 are determined to be in an error condition, and reference numbers for the ICs corresponding to those components are outputted to the control panel.

Step 33: The processing C is applied to the DSPs DSP1_1, DSP1_2 and DSP1_4 while the processing A is applied to the DSP DSP1_3, and the outputs of the modulators DO1 and DO2 are selected to the inputs of the demodulators DI5 and DI6, respectively, by the routing switcher.

Step 34: A similar comparison to that described above is performed, and if the data does not coincide, the DSP DSP1_3 and the demodulators DI5 and DI6 are determined to be in an error condition and reference numbers for the ICs are outputted to the control panel.

Step 35: The processing C is applied to the DSPs DSP1_1 to DSP1_3 while the processing A is applied to the DSP DSP1_4, and the outputs of the modulators DO1 and DO2 are selected to be the inputs of the demodulators DI7 and DI8, respectively, by the routing switcher.

Step 36: A similar comparison to that described above is performed, and if the data do not coincide, the DSP DSP1_4 and the demodulators DI7 and DI8 are determined to be in an error condition and reference numbers for the ICs corresponding to those components are outputted to the control panel.

Step 37: When, after testing the functioning of all the DSPs, the modulators, the demodulators and the routing switcher, no error condition has been found, a no error indication is made on the control panel, thereby completing the self-diagnosis.

In summary, in the self-diagnosis technique according to the present invention, as seen from the flow charts described above, an output is fed back to an input of the system so that a DSP signal is repeatedly generated, passed through the system and received to effect a loop test, and if there is a failed IC, then the same is identified and a reference number for the IC is outputted to the indicator.

The digital mixer described above is advantageous in the following respects:

1. The mixer can perform phase variation which does not cause switching noise regardless of the level, the phase, the frequency and so forth of the audio data.

2. The perceived operation and the actual response in sound volume when the mute switch of a fader is switched on or off or when a fader is operated are brought closer together. Further, since the host computer need not distinguish between respective coefficients for a mute switch and a fader, the processing speed is increased and the program is simplified.

3. Production of noise upon switching of an effector is eliminated, and upon reproduction of parameter data from a snapshot memory (scene data memory), reproduction of a scene can be made without any incongruous effect being produced.

4. Upon insertion of an effector, an editing operation can be performed completely in digital form and without converting audio data into analog data. Further, since the operator can arbitrarily select the level of an insertion out signal, internal and external effectors can be used at optimum S/N ratios without causing signal clipping.

5. Setting of parameters for the mixer can be performed with respect to sources of audio signals, and regardless of the channel for which a source is selected by the routing switcher, if the parameters are set once, then changing the parameters can be performed instantaneously simply by changing over the source.

6. Since an indication of a reference level on the bar graph meter can be recognized at a glance, mixing operations are facilitated, and since the reference level can be varied, a high degree of universality is achieved.

7. In a multi-output digital audio apparatus, a unit-by-unit test of component functioning is facilitated and self-diagnosis can be performed rapidly. Further, since a component reference number is outputted, maintenance is facilitated. Furthermore, maintenance can also be performed with connection of an external apparatus.

Having now fully described the invention, it will be apparent to one of ordinary skill in the art that many changes and modifications can be made thereto without departing from the spirit and scope of the invention as set forth herein.

What is claimed is:

1. A method of performing a self-diagnosis in a digital signal processing system which includes a digital signal processing apparatus, the digital signal processing apparatus having plural input ports which correspond to respective signal processing channels of the apparatus, and an output port from which the apparatus outputs processed signals, the method comprising the steps of:

repeatedly generating a test signal within said digital signal processing apparatus, selectively connecting said output port of said digital signal processing apparatus in sequence to said plural input ports of said digital signal processing apparatus and transmitting the test signal from said output port of said digital signal processing to said selected input port of said digital signal processing apparatus by way of a diagnosis loop provided between said output and input ports of said digital signal processing apparatus to effect a loop test of said digital signal processing apparatus;

processing data representative of a result of the test;

indicating the processed data on an indicator; and when the result of the test represents an error condition in an electronic component of said digital signal processing apparatus, providing to said indicator a reference number corresponding to said electronic component so that the reference number is indicated on said indicator.

2. A digital signal processing system having a self-diagnosing function, comprising:

a digital signal processing apparatus including a plurality of electronic components for processing a signal within a signal channel, each of said electronic components having a unique reference number;

means for coupling an output of said digital signal processing apparatus to an input of said digital signal processing apparatus;

control means for causing one after another of said electronic components to generate a predetermined signal while the other electronic components are in a condition for passing the predetermined signal therethrough, determining whether or not the output of said digital signal processing apparatus is correct, and when the output of said digital signal processing apparatus is not correct, outputting the reference number of the electronic component which then generated the predetermined signal; and means for visually indicating the reference number of the electronic component.

3. A digital signal processing system according to claim 2, wherein said electronic components are caused to generate the predetermined signal one after another successively beginning with that one of said electronic components adjacent the output of said digital signal processing apparatus.

4. A digital signal processing system having a self-diagnosing function, comprising:

a digital signal processing apparatus including a plurality of signal channels each made up of a plurality of electronic components for processing signals within the respective channel, each of said electronic components having a unique reference number;

means for coupling an output of said digital signal processing apparatus to an input of said digital signal processing apparatus;

control means for causing one after another of said electronic components to generate a predetermined signal while the other electronic components are in a condition for passing the predetermined signal therethrough, determining whether or not the output of said digital signal processing apparatus is correct and when the output of said digital signal processing apparatus is not correct, outputting the reference number of the electronic component which then generated the predetermined signal; and means for visually indicating the reference number of the electronic component.

5. A digital signal processing system according to claim 4, wherein the electronic components in each of said channels are caused to generate the predetermined signal one after another successively beginning with that one of said electronic components adjacent the output of said digital signal processing apparatus.

6. A digital signal processing system according to claim 4, wherein the same number of said electronic components are provided in each of said channels, and said electronic components are caused to generate the predetermined signal one after another successively in order of said channels and beginning with those of said electronic components adjacent the output of said digital signal processing apparatus.

7. A digital signal processing system according to claim 6, further comprising an output electronic component connected between said control means and an output side of said channels.

8. A digital signal processing system according to claim 4, further comprising routing means for selectively applying a plurality of input signals to said channels of said digital signal processing apparatus, said input signals including a signal from said coupling means.

9. A digital signal processing system according to claim 8, wherein said routing means receives input signals in a first signal format and each of said channels of said digital signal processing apparatus includes a first electronic component connected to receive one of said input signals in the first signal format from said routing means and for outputting a signal in a second signal format, each of said electronic components of said digital signal processing apparatus except the first electronic components being arranged to process signals in the second signal format and said digital signal processing apparatus outputting an output signal in the second signal format, said coupling means including means for converting the output signal of said digital signal processing apparatus from the second signal format to the first signal format.

10. A digital signal processing system according to claim 9, wherein the signals in the second signal format are formed from a different number of bits from the number of bits of the signals of the first signal format.

11. A digital signal processing system according to claim 10, wherein said digital signal processing apparatus includes signal generating means, selectively connectable to said coupling means, for generating the predetermined signal when any of said first electronic components is to be tested, the predetermined signal being generated in the second signal format by the signal generating means and being converted to the first signal format by said converting means of said coupling means.

12. A digital signal processing system according to claim 9, wherein each of said electronic components of said digital signal processing apparatus except for the first electronic components is formed from a digital signal processor.

13. A digital signal processing system according to claim 9, wherein an output of said converting means of said coupling means is outputted as an output signal from said digital signal processing system.

* * * * *